United States Patent
Ando et al.

(10) Patent No.: US 6,458,253 B2
(45) Date of Patent: Oct. 1, 2002

(54) THIN FILM PRODUCTION PROCESS AND OPTICAL DEVICE

(75) Inventors: Kenji Ando, Kawasaki; Minoru Otani, Tokyo; Yasuyuki Suzuki, Yokohama; Toshiaki Shingu; Ryuji Biro, both of Kawasaki; Hidehiro Kanazawa, Tokyo, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/804,266

(22) Filed: Mar. 13, 2001

(30) Foreign Application Priority Data

Mar. 13, 2000 (JP) .................................. 2000-068513
May 24, 2000 (JP) .................................. 2000-153245

(51) Int. Cl.$^7$ ............................................... C23C 14/34
(52) U.S. Cl. ........................... 204/192.15; 204/192.12; 204/192.26
(58) Field of Search ................... 204/192.12, 192.15, 204/192.26, 298.07, 298.14

(56) References Cited

U.S. PATENT DOCUMENTS 5,914,017 A  * 6/1999 Clarke .................... 204/298.07
5,981,075 A   11/1999 Ohmi et al. ................. 428/428
6,217,719 B1   4/2001 Kanazawa et al. ..... 204/192.12

FOREIGN PATENT DOCUMENTS

| | | | |
|---|---|---|---|
| DE | 42 35 953 A1 | 4/1994 | ............ H05H/1/46 |
| EP | 860 513 A2 | 8/1998 | ............ C23C/14/34 |
| JP | 4-289165 | 10/1992 | ............ C23C/14/31 |
| JP | 5-182911 | 7/1993 | ......... H01L/21/203 |
| JP | 6-17248 | 1/1994 | ............ C23C/14/35 |
| JP | 7-166344 | 6/1995 | ............ C23C/14/34 |
| JP | 8-167596 | 6/1996 | ....... H01L/21/3065 |

OTHER PUBLICATIONS

J. Kolbe et al., "Optical Losses of Fluoride Coatings for UV/VUV Applications Deposited by Reactive IAD and IBS Processes," $36^{th}$ Annual Technical Conference Proceedings, Society of Vacuum Coaterspp. 44–50 (1993).

* cited by examiner

Primary Examiner—Steven H. VerSteeg
(74) Attorney, Agent, or Firm—Fitzpatrick, Cella, Harper & Scinto

(57) ABSTRACT

A process of producing a thin film is disclosed. The process comprises the steps of providing a vessel; placing a target such that a surface to be sputtered of the target surrounds a discharge space; placing a substrate on a side of an opening of the space such that the substrate faces an anode disposed so as to close another opening of the space surrounded by the target; supplying a sputtering gas and a fluorine-containing gas into the vessel; and supplying a dc power or a power obtained by superimposing pulses with reversing polarities on the dc power, between the target and the anode, wherein a discharge is induced in the discharge space to sputter the target, thereby forming a fluorine-containing thin film on the substrate.

18 Claims, 12 Drawing Sheets

(2 of 12 Drawing Sheet(s) Filed in Color)

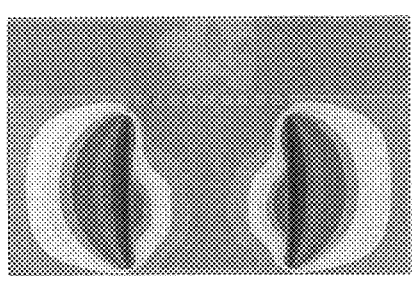 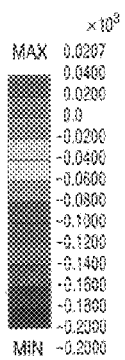 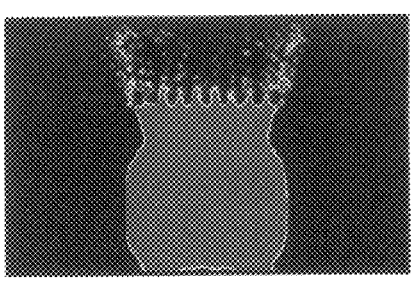 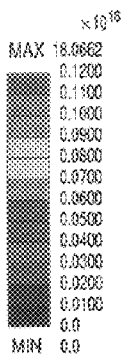
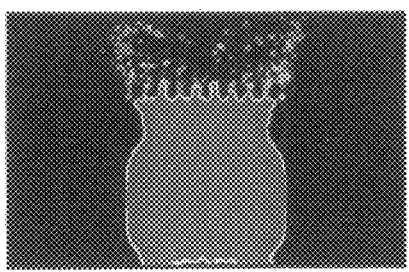 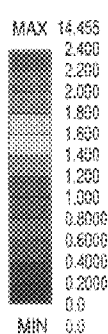 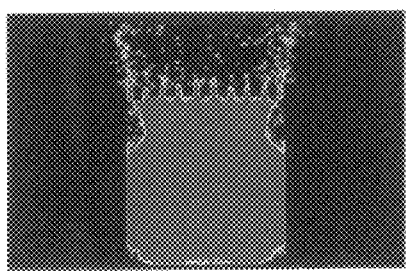 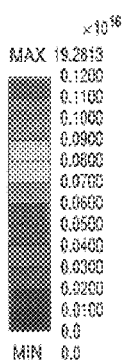
FIG. 6A  FIG. 6B  FIG. 6C  FIG. 6D

| NO. | H2O PARTIAL PRESSURE | H2 PARTIAL PRESSURE | LOSS (193mm) FILM THICKNESS 100mm | LOSS (248mm) FILM THICKNESS 100mm | OXYGEN CONTENT OF FILM | MgO/MgOH |
|---|---|---|---|---|---|---|
| 1 | $1 \times 10^{-2}$ Pa | 0.35 Pa | 0.1% | 0.1% | 4.0 wt% | 0.25 |
| 2 | $1 \times 10^{-2}$ Pa | 0.10 Pa | 0.1% | 0.1% | 4.5 wt% | 0.30 |
| 3 | $1 \times 10^{-4}$ Pa | 0.10 Pa | 5.5% | 0.4% | 6.0 wt% | 0.40 |
| 4 | $1 \times 10^{-4}$ Pa | 0.35 Pa | 3.5% | 0.3% | 5.5 wt% | 0.40 |
| 5 | $1 \times 10^{-2}$ Pa | 0.01 Pa | 1.5% | 0.1% | 6.5 wt% | 0.35 |
| 6 | $1 \times 10^{-4}$ Pa | 0.01 Pa | 10.5% | 0.5% | 7.5 wt% | 0.45 |
| 7 | $5 \times 10^{-1}$ Pa | 0.1 Pa | 4.0% | 0.1% | 7.0 wt% | 0.45 |

THIN FILM PRODUCTION PROCESS AND OPTICAL DEVICE

BACKGROUND OF THE INVENTION

1. Field of the Invention

The present invention relates to a production process of a thin film, and an optical device and, more particularly, to a process of forming a fluorine-containing thin film very susceptible to plasma damage, at a low temperature by a sputtering method of depositing a thin film on a substrate mounted on a substrate holder by sputtering of a target.

2. Related Background Art

In the fields of optics heretofore, vacuum vapor deposition methods of heating a film forming source in vacuum by an electron beam or the like to evaporate it and deposit evaporated particles on a substrate have mainly been used for forming optical thin films such as antireflection films, mirrors, and so on.

In general, the antireflection films, mirrors, etc. are comprised of either a material with a low refractive index such as magnesium fluoride or the like and a material with a high refractive index such as zirconium oxide, tantalum oxide, titanium oxide, or the like, or a multilayer film as a combination of these materials, or the like; layer construction, film thicknesses, etc. are adjusted in various ways, depending upon optical performance required.

The evaporation methods are deposition methods that are simple in system configuration, capable of forming a film at a high speed on a large-area substrate, and excellent in productivity, but they have difficulties associated with controlling the thickness with a high accuracy and with developing automatic systems. Furthermore, films formed at a low substrate temperature have problems of insufficient strength of the film, which can be readily damaged, low adhesion between the film and a substrate, and so on.

However, there has been a growing demand for the increase in production efficiency in recent years. Thus, demands for coatings by sputtering, which are advantageous in terms of labor-saving production steps, stability of quality, film quality (adhesion, film strength) and so on, as compared with the vacuum evaporation methods, have also been increasing for these optical thin films.

When thin films of oxide dielectrics of $ZrO_2$, $Ta_2O_5$, $TiO_2$, and so on are formed by the sputtering method, thin films with a low absorption and high refractive index can easily be obtained.

The sputtering system commonly used heretofore for production of thin films is a parallel plate magnetron sputtering apparatus. In this apparatus, a target as a material for a thin film and a substrate mounted on a substrate holder are placed so as to face each other in a vacuum chamber. A plasma is generated to sputter the target. Target particles driven out of the target by sputtering are deposited on the substrate. This is a simple film forming method excellent in highspeed film formation, large-area film formation, target lifetime, and so on.

Meanwhile, there are known sputtering systems other than the parallel plate type systems.

Japanese Patent Application Laid-Open No. 6-17248 describes a proposal of an off-axis type sputtering system in which the substrate or the target is rotated by 90 from the configuration of the parallel plate sputtering system with the target and the substrate facing each other.

Furthermore, Japanese Patent Application Laid-Open No. 5-182911 describes a proposal of a facing target sputtering system in which surfaces to be sputtered face each other with a space therebetween, a magnetic field is generated in a direction perpendicular to the sputtered surfaces, and a thin film is formed on the substrate placed beside a space between the targets.

Japanese Patent Application Laid-Open No. 8-167596 describes a proposal of a plasma processing system and the like in which at least one mesh plate for separation of a plasma is disposed between a plasma generating chamber for generating a plasma and a plasma processing chamber for housing a substrate to be subjected to film formation, the mesh plate is provided with a plurality of apertures, and the diameter of the apertures is not more than two times the Debye shielding length of the plasma.

In recent years, systems using the ArF excimer laser light source and the $F_2$ excimer laser light source have been developed as optical devices used for precision processing. There is an increasing demand for fluorine-containing films of high quality and high durability, which are used in optical parts (or optical components) in optical systems.

Under such circumstances, the inventors have first investigated a method of forming a fluorine-containing film of aluminum fluoride, magnesium fluoride, or the like, using the parallel plate type sputtering system.

For example, a method of forming a fluoride thin film by sputtering is disclosed in Japanese Patent Application Laid-Open No. 4-289165. This sputtering method is for forming a film of an alkali earth metal fluoride, such as $MgF_2$ or the like, by use of a mixture of an inert gas, such as Ar or the like, and a fluorine-based gas, such as $CF_4$ or the like.

There is also a known method of DC sputtering using a metal target and a mixture of an inert gas of Ar or the like and a fluorine-based gas of $CF_4$ or the like, as disclosed in Japanese Patent Application Laid-Open No. 7-166344.

However, when a film of a fluoride material is formed on a lens or the like by introduction of a reactive gas of $NF_3$ or $F_2$ gas or the like, a cathode sheath voltage will accelerate negative ions of fluorine, and fluorine compounds sputtered from the target and high energy particles thus generated will be incident on the film to physically damage it or vary its composition. Furthermore, there can be damage due to the negative ions, such as undesired etching of the substrate instead of a desired formation of a film on the substrate, depending on the species of the target material and the sputtering conditions. Furthermore, the ions and electrons accelerated by the ion sheath may damage the film formed on the surface of the substrate, raise the temperature of the substrate, or increase optical absorption of the film. Particularly, for the ultraviolet light with a high energy, the optical transmittance will be significantly lowered.

The prior art thin film production methods are hardly satisfactory in these aspects.

SUMMARY OF THE INVENTION

An object of the present invention is to provide a process of producing a thin film having a high transmittance for the ultraviolet light, particularly, for the vacuum ultraviolet light and being capable of effectively utilizing the light, and also to provide an optical device.

Another object of the present invention is to provide a process of producing a thin film that suffers little damage from negative ions, positive ions, and electrons, and also to provide an optical device.

An aspect of the present invention is a process of producing a thin film, which comprises the steps of:

providing a vessel;

placing a target such that a surface to be sputtered of the target surrounds a discharge space;

placing a substrate on a side of an opening of the space such that the substrate faces an anode disposed so as to close another opening of the space surrounded by the target;

supplying a sputtering gas and a fluorine-containing gas into the vessel; and supplying a dc power or a power obtained by superimposing pulses with reversing polarities on the dc power, between the target and the anode, wherein a discharge is induced in the discharge space to sputter the target, thereby forming a fluorine-containing thin film on the substrate.

In the present invention, it is desirable to supply the sputtering gas from the anode side into the discharge space and to supply the fluorine-containing gas from the exterior of the discharge space into the vessel.

In the present invention, it is desirable to supply a reducing gas from the anode side into the discharge space.

In the present invention, it is desirable to supply water from the exterior of the discharge space into the vessel.

In the present invention, it is desirable to use a rare gas as the sputtering gas.

In the present invention, it is desirable to use at least one of a fluorine gas, nitrogen fluoride gas, carbon fluoride gas, sulfur fluoride gas, or hydrofluorocarbon gas, as the fluorine-containing gas.

In the present invention, it is desirable to supply a gas selected from hydrogen gas, deuterium gas, hydrocarbon gas, and ammonia gas, from the anode side toward the discharge space.

In the present invention, it is desirable that the anode's surface is formed of the same material as the target and that the anode has a number of gas discharge holes.

In the present invention, it is desirable to place a magnetic shield of a magnetic material having a number of holes between the substrate and the target.

In the present invention, it is desirable that the target be comprised of a metal comprising at least one of Mg, Al, La, Nd, Th, Li, Y, Ca, or Gd.

In the present invention, it is desirable to produce, as the fluorine-containing thin film, a film of magnesium fluoride, aluminum fluoride, lanthanum fluoride, neodymium fluoride, thorium fluoride, lithium fluoride, yttrium fluoride, calcium fluoride, or gadolinium fluoride.

In the present invention, it is desirable to produce a thin film under such conditions that the electron temperature Te of the plasma is not more than 3 eV, the electron density is not more than $2 \times 10^8$ electrons/cm$^3$, and the difference between the potential of the plasma and the floating potential of the substrate is not more than 2 V, on the surface of the substrate.

In the present invention, it is preferable to use calcium fluoride as the material of the substrate.

In the present invention, it is desirable to monitor the voltage applied to the target and to control the supply rates of the reactive gases so that the voltage applied to the target becomes approximately constant.

In the present invention, it is desirable to set the frequency of the pulses within the range of 1 kHz to 500 kHz.

In the present invention, it is desirable to maintain the partial pressure of water within the range of not less than $1 \times 10^{-3}$ Pa and not more than $1 \times 10^{-1}$ Pa and the partial pressure of hydrogen gas not less than $5 \times 10^{-2}$ Pa during the film formation.

In the present invention, it is desirable to form a thin film comprising magnesium fluoride as a main component and containing oxygen in a content of not more than 5 wt % and MgO in a content of not more than 1.5 wt %.

In the present invention, it is desirable to form a thin film comprising magnesium fluoride as a main component and containing a rare gas in a content of 1 wt % to 10 wt %.

Another aspect of the present invention is an optical device comprising an optical system comprising an optical part obtained by forming a fluorine-containing thin film on a substrate by the above-stated thin film production process, in combination with a laser light source for generating an ultraviolet light.

BRIEF DESCRIPTION OF THE DRAWINGS

The file of this patent contains at least one drawing executed in color. Copies of this patent with color drawings will be provided by the Patent and Trademark Office upon request and payment of the necessary fee.

FIGS. 6A, 6B, 6C and 6D are schematic views showing the state of a plasma in the sputtering apparatus used in the present invention;

DETAILED DESCRIPTION OF THE PREFERRED EMBODIMENTS

Embodiment 1

Figure 1A:
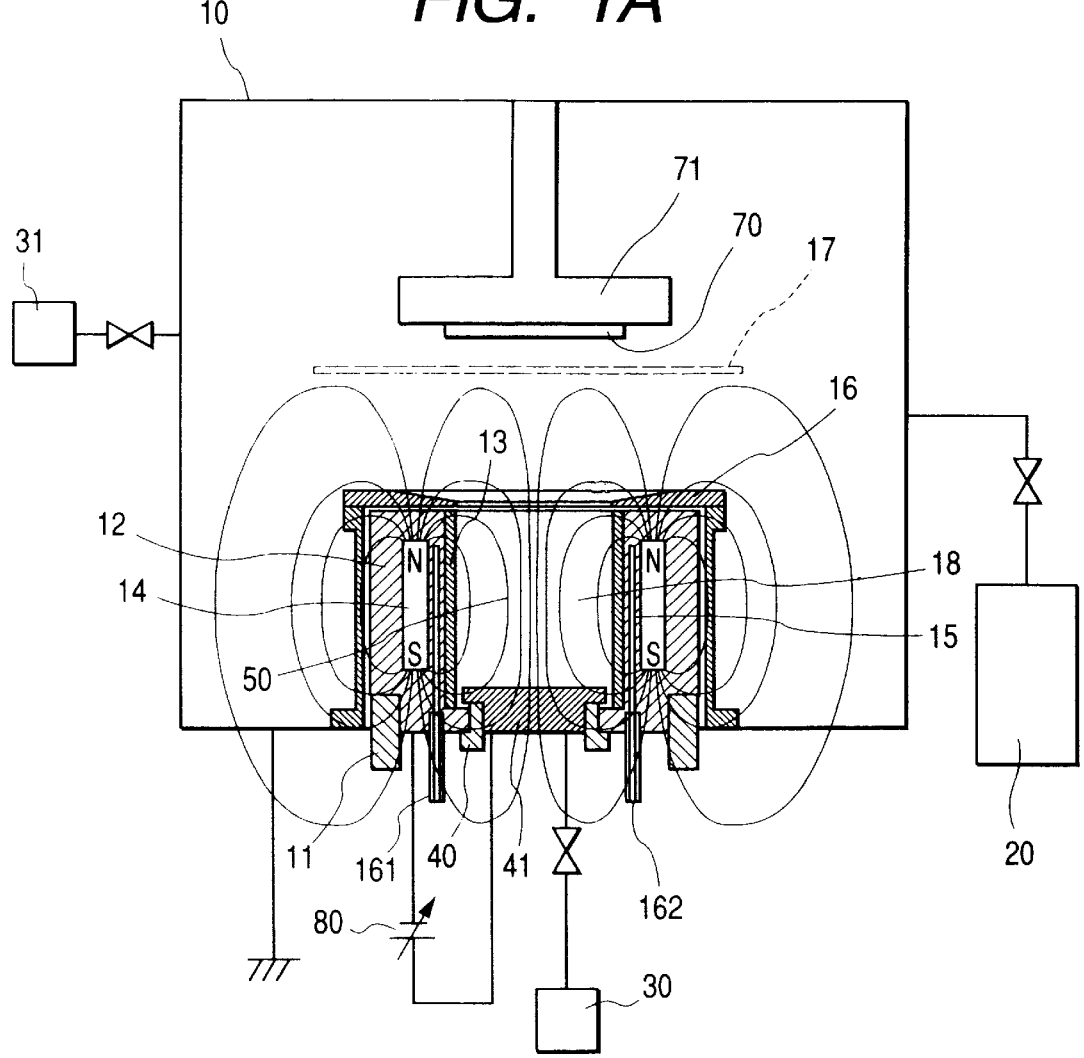
FIG. 1A is a schematic view of a sputtering apparatus used in the present invention.
Figure 1B:
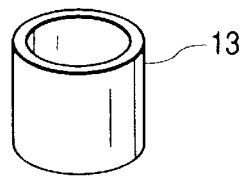
FIG. 1B is a schematic perspective view of a target used in the present invention.

First, a reactive sputtering apparatus used in the production process of a thin film according to the present invention will be described. FIG. 1A is a vertical, cross-sectional view of the reactive sputtering apparatus. FIG. 1B shows an example of a target used in the present invention.

In FIG. 1A, reference numeral 10 designates a vessel, which can be hermetically sealed and the interior of which can be evacuated, and the interior of this vessel 10 is evacuated to vacuum by an evacuation system 20.

In the vessel 10, there is a target holder 12 fixed thereto through an insulating member 11 and a target 13 is placed on the target holder 12.

In this example, the target is such a substantially cylindrical target, that a discharge space 18 is surrounded by its internal surface to be sputtered, as illustrated in FIG. 1B.

An anode 41 is fixed through an insulating member 40 on the bottom surface side of the substantially cylindrical target 13. The anode 41 is made of the same material as the target 13 and is isolated independently of the target 13 electrically serving as a cathode, by the insulating member 40.

Behind this target 13, a plurality of substantially cylindrical permanent magnets, or an integral ring-shaped permanent magnet 14 as a magnetic field generating means, are disposed, so as to surround the outer surface of the target 13 and to be parallel to the sputter surface of the internal wall of the substantially cylindrical target 13.

In the section of the target 13 and the target holder 12 corresponding thereto, cooling water is circulated through cooling pipes 161, 162 inside a water cooling jacket 15, so as to cool the target 13 and permanent magnet 14.

The magnetic poles of the substantially cylindrical permanent magnets 14 are arranged such that one end facing the substrate 70 is the pole N while the other end facing the anode 41 is the pole S and such that the magnets can form a magnetic field 50 of a closed loop.

A sputtering gas for formation of plasma is introduced from a sputtering gas introducing system 30 connected to the anode 41, into the discharge space 18 in the vessel 10.

A reactive gas for reactive sputtering film formation is introduced from the exterior of the discharge space 18 into the vessel 10 by a reactive gas introducing system 31 connected to the vessel 10. In the present invention, a fluorine-containing gas is used as the reactive gas.

Numeral 16 denotes a shield plate for shielding discharge, which functions to prevent sputtering of materials other than the target material and to prevent incorporation of impurities into the thin film, which serves as a deposition preventing plate for preventing the sputtering particles from being deposited on the target holder 12, the insulating member 11 and so on, and which also serves as an anode.

A substrate holder 71 for holding the substrate 70 on which the thin film is to be formed is located above the shield plate 16. A shutter plate 17 having an opening/closing mechanism is placed in the vicinity of the substrate holder between the substrate holder 71 and the opening of the target, to prevent a film containing a large amount of oxides and impurities from being deposited on the substrate 70 during pre-sputtering.

On the other hand, a power supply means 80 for supplying dc power or power obtained by superimposing pulses with reversing polarities on dc power, as the sputtering power for inducing discharge, is connected to the anode 41 on the plus side and to the target holder 12 and target 13 of the cathode on the minus side.

Figure 2:
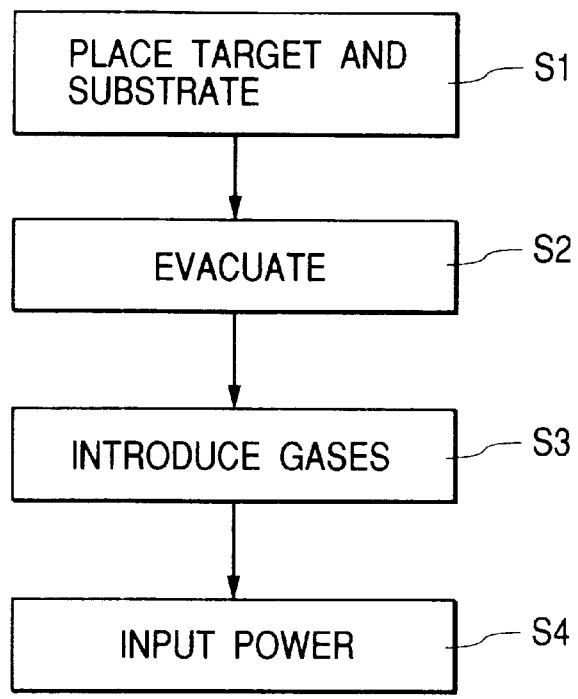
FIG. 2 is a view showing a flowchart of production steps of a thin film according to an embodiment of the present invention.

Next, a production process of a thin film according to an embodiment of the present invention will be briefly described referring to FIG. 2.

First, the apparatus of FIG. 1A having the vessel 10 is prepared.

The target 13 is placed on the target holder 12 such that the surface to be sputtered of the target 13 surrounds the discharge space 18. The substrate 70 is placed on the side of a first (upper) opening of the space 18 such that the substrate faces the anode 41 disposed, so as to close (or block) a second (lower) opening of the space 18 surrounded by the target 13 (step S1).

The interior of the vessel 10 is evacuated as needed (step S2).

After that, the sputtering gas is supplied from the sputtering gas introducing system 30 and the fluorine-containing gas as the reactive gas is supplied from the reactive gas introducing system 31 (step S3).

The dc power or the power obtained by superimposing pulses with reversing polarities on the dc power is supplied from the power supply means 80 between the target 13 and the anode 41 (step S4).

A discharge is induced in the discharge space 18 in this fashion to sputter the target 13 by particles of the sputtering gas, thereby forming a fluorine-containing thin film on the substrate 70.

In the present embodiment, the sputtering gas (at least one rare gas selected from He, Ne, Ar, Kr, Xe, and Rn) is supplied from the anode 41 side toward the discharge space 18, and the fluorine-containing gas (at least one selected from fluorine gas, nitrogen fluoride gas, carbon fluoride gas, sulfur fluoride gas, and hydrofluorocarbon gas) is supplied from the exterior of the discharge space 18 into the vessel 10, thereby preventing the sputtered surface of the target from being fluorinated.

Among the rare gases, He is more preferable, because it promotes the surface reaction by incidence of metastable He in the plasma onto the substrate surface.

Furthermore, a reducing gas (at least one gas selected from hydrogen gas, deuterium gas, hydrocarbon gas, and ammonia gas) is supplied from the anode 41 side toward the discharge space 18, thereby further preventing fluorination and oxidation of the target and suppressing light absorption of the thin film formed, in cooperation with water supplied from the exterior of the discharge space 18 into the vessel 10.

The reducing gas and water ($H_2O$) terminate unbound bonds (dangling bonds) by H and OH groups to remove the dangling bonds from the inside of the formed film, thus reducing absorption of light.

The surface of the anode 41 is made of the same material as the target 13 and the anode 41 has a number of gas discharge holes. Thus, it can uniformly supply the sputtering gas into the discharge space.

The anode is preferably an electroconductive body having many holes. In addition, it is preferable that at least a surface of the anode that contacts the plasma (i.e., the internal surface facing the discharge space) is made of the same material as the target. Among others, it is preferable to use an anode of a porous member the pores of which can be utilized as gas discharge holes. Such a porous member can be made, for example, by baking metal particles of the same material as the target.

In the present embodiment, the dc power is supplied from the power supply means between the target and the anode. Alternatively, the power obtained by superimposing pulses with reversing polarities on the dc power may also be supplied from the power supply means between the target and the anode.

Figure 3:
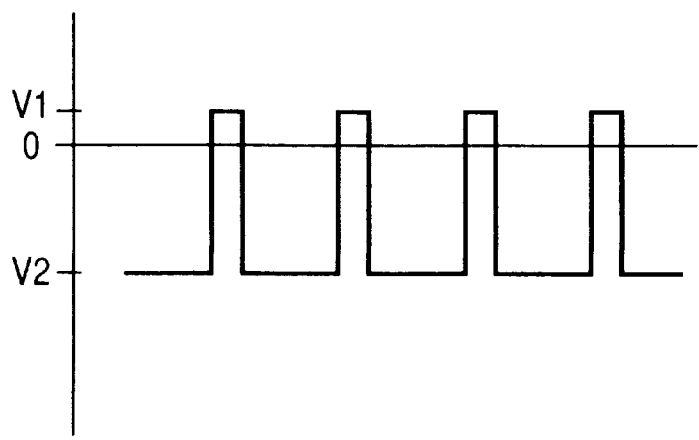
FIG. 3 is a view showing an example of the waveform of a voltage applied to a cathode, used in the present invention.

FIG. 3 shows the waveform of the output voltage on the cathode side of the power supply means for applying the dc power with pulses of different polarities superimposed thereon. In this case, the frequency of pulses is preferably set within the range of 1 kHz to 500 kHz. The pulses with reversing polarities (pulses of a voltage V1) can neutralize accumulation of electrons during formation of fluorine-containing dielectric films to prevent abnormal discharge.

When dc power is supplied, a constant negative voltage (for example, a voltage V2 in FIG. 3) is applied as the output voltage on the cathode side.

In addition, as described hereinafter, it is preferable to monitor the voltage applied to the target and to control feed rates of various gases such that the voltage applied to the target becomes approximately constant.

Furthermore, as described hereinafter, it is also preferable to place a magnetic shield of a magnetic material having many holes between the substrate 70 and the target 13.

The sputtering pressure during film formation is desirably within the range of 0.3 to 3 Pa. When the sputtering pressure is not more than the upper limit, it is possible to obtain a film with practically acceptable uniformity and a steady refractive index in the thickness direction. When the sputtering pressure is not less than the lower limit, a stable discharge continues within the practically acceptable range. More preferably, it is desirable to set the sputtering pressure within the range of 0.4 to 1 Pa. The most desirable range of the sputtering pressure is 0.4 to 0.8 Pa.

When sputtering is carried out under the above-stated conditions using the apparatus described above, it is possible to maintain on the surface of the substrate 70 a plasma such that the electron temperature Te of the plasma is not more than 3 eV, the electron density of the plasma is not more than $2 \times 10^8$ electrons/cm$^3$, and the potential difference between the plasma potential and the floating potential of the substrate is not more than 2 V.

When the plasma conditions are within these ranges, little damage is caused in the thin film on the substrate.

The sputtering apparatus described above was actually operated under the sputtering pressure within the range of 0.3 Pa to 3 Pa and the electron temperature Te, the electron density Ne, and the plasma potential Vp of the plasma were measured by the Langmuir probe method from current-voltage characteristics obtained by putting a metal probe into the substrate position in the vessel, applying a dc voltage from the outside to the probe. The measurement results verified that the electron temperature Te was not more than 3 eV, the electron density Ne not more than $2 \times 10^8$ electrons/cm$^3$, and the plasma potential not more than 2 V.

There exist positive ions substantially in the same number as the electron density Ne in the vicinity of the substrate of the insulting matter and the positive ions are accelerated by the voltage corresponding to the difference between the plasma potential Vb and the floating potential Vf to collide with the substrate. In this case, the floating potential Vf is between the plasma potential Vp and the earth potential.

In the ordinary RF or DC magnetron sputtering, though there are slight variations depending upon gas species and conditions, normally, the electron temperature Te is 5 eV to ten and several tens eV, the electron density Ne is $1 \times 10^9$ to $1 \times 10^{11}$ electrons/cm$^3$, the voltage of the difference between the plasma potential Vp and the floating potential Vf is also about several tens V, which will do great damage to the substrate and the deposited film.

The above constitution of the present invention makes it possible to greatly decrease plasma damage of the substrate and the deposited film.

The substrate 70 used in the present invention may be any material, e.g., any one of conductors such as stainless steel, aluminum, and so on, any one of semiconductors such as silicon and the like, or any one of insulators such as silicon oxide, aluminum oxide, resin, and so on. The substrate for fabrication of optical parts for ultraviolet light is preferably one selected from silica glass, calcium fluoride crystals, and so on.

The material of the target 13 used in the present invention is a metal (pure metal or alloy) containing at least one selected from Mg, Al, La, Nd, Th, Y, Li, Ca, and Gd, and is selected depending on the thin film to be formed.

The fluorine-containing gas used in the present invention is fluorine gas or a gas of a fluorine compound; specifically, any one selected from $F_2$, $NF_3$, $CF_4$, $C_2F_6$, $C_3F_8$, $CHF_3$, and $SF_6$.

In the present invention, the fluorine-containing thin film to be formed is a film of a fluoride containing at least one of the above-stated metals; specifically, magnesium fluoride, aluminum fluoride, lanthanum fluoride, neodymium fluoride, thorium fluoride, yttrium fluoride, lithium fluoride, calcium fluoride, or gadolinium fluoride.

Embodiment 2

Figure 4:
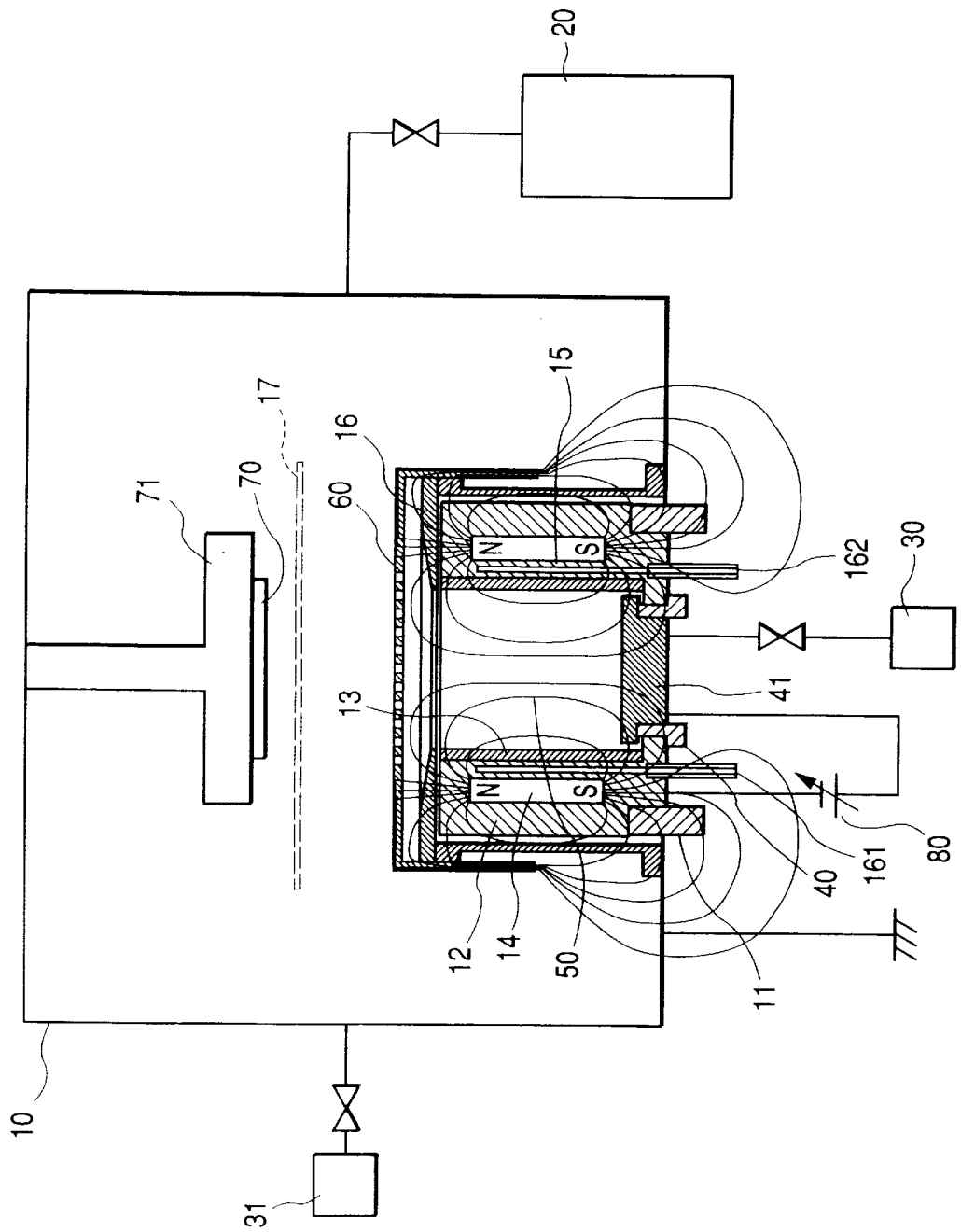
FIG. 4 is a schematic view showing another sputtering apparatus used in the present invention.

FIG. 4 is a cross-sectional view of a reactive sputtering apparatus used in the production process of a thin film according to the present invention.

This apparatus is constructed in a structure obtained by providing the reactive sputtering apparatus illustrated in FIG. 1A with a magnetic shield plate 60, and the fundamental structure of the apparatus and the basic steps of the film forming process are the same as those described above.

The magnetic shield plate 60 peculiar to the present embodiment will be described hereinafter.

The magnetic shield plate 60 is placed between the substrate holder 71 and the shield plate 16 on the side opposite to the side of the anode 41. The magnetic shield plate 60 is made of a permalloy with a high permeability and is provided in the part facing the opening of the cylindrical target. The magnetic shield plate 60 has many holes of a diameter of 5 mm in an aperture ratio of 50% and it covers a half part of the permanent magnet in height around the periphery of the permanent magnets 14. It can be seen that the magnetic shield plate 60 captures the magnetic field 50, which was spread between the target and the substrate in the absence of the magnetic shield plate 60. This permits the apparatus to generate a plasma at a lower temperature and in a lower density in the vicinity of the substrate.

FIGS. 5A to 5D show the result of plasma simulation carried out in the apparatus configuration without a magnetic shield plate of FIG. 1A.

Similarly, FIGS. 6A to 6D show the result of plasma simulation carried out in the apparatus configuration with the magnetic shield plate of FIG. 4.

Figure 5A:
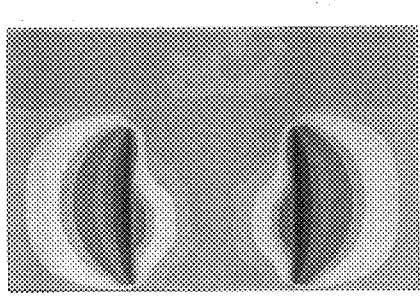
FIGS. 5A, 5B, 5C and 5D are schematic views showing the state of a plasma in the sputtering apparatus used in the present invention.
Figure 5C:
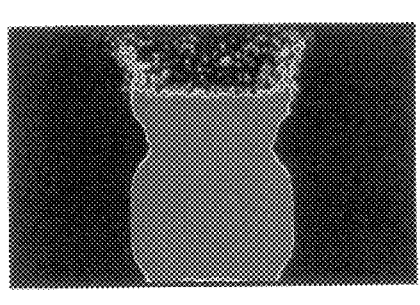
Figure 5B:
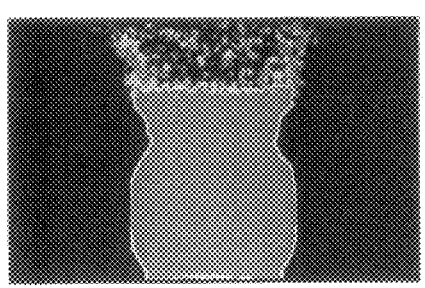
Figure 5D:
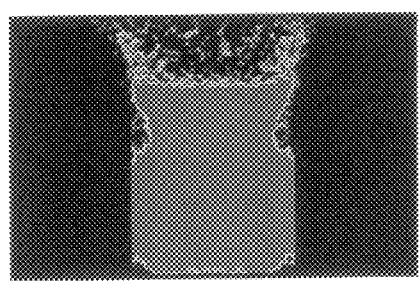

FIGS. 5A and 6A both show a plasma potential distribution, FIGS. 5B and 6B both a distribution of electron temperature Te, FIGS. 5C and 6C both a distribution of electron density Ne, and FIGS. 5D and 6D both a distribution of ion density Ni. It is seen from comparison between the figures that in all the items, the apparatus configuration of FIG. 4 provided with the magnetic shield demonstrates the lower plasma density in the vicinity of the substrate and the higher effect of confining the plasma in the space surrounded by the substantially cylindrical target and the anode.

The decrease of negative ion damage achieved by the embodiments of the present invention described above is based particularly on the following points.

(1) The target is arranged so as to surround the discharge space such that the sputtered surfaces thereof face each other.

The target herein is the one of substantially cylindrical shape as a preferred form. This substantially cylindrical shape means a cylinder such that a cross section of the target in a plane perpendicular to the drawing of FIG. 1A or FIG. 4 is a circle or an ellipse, and a schematic perspective view of the target is as illustrated in FIG. 1B.

When the target is of the form having the substantially cylindrical inner wall as described, most of negative ions generated at a certain point of the target impinge on the target surface at a symmetric position on the other side of the center line of the target, so that negative ions directly entering the substrate can be reduced. Namely, the substrate is kept from the negative ion damage by employing the arrangement in which normals to the sputter surface do not intersect with the film forming surface of the substrate on the substrate holder.

In view of the above action, the form of the target used in the present invention is not limited to the substantially cylindrical shape, and it can also be contemplated that the discharge space is surrounded continuously or intermittently by one target or a plurality of targets.

(2) Optionally, such a structure that the reactive gas is not directly blown against the target may be further adopted to prevent fluorination of the target.

The target, when fluorinated by the fluorine-containing gas, tends to generate negative ions during sputtering. In the present embodiment, the sputtering gas is supplied through the anode that forms the bottom surface of the substantially cylindrical target surrounding the discharge space, thereby establishing an environment in which the space inside the substantially cylindrical target is filled with the sputtering gas. This makes it difficult for the reactive gas to intrude into the substantially cylindrical target, so that the target can be sputtered while maintaining its metal state.

The decrease of the positive ions and electron damage can be accomplished by making a plasma of a relatively high density for sputtering distant from the substrate and confining the plasma in the space created by the target and the anode as much as possible. Specifically, it is achieved as follows.

(1) By using a dc power or a power obtained by superimposing pulses with reversing polarities on the dc power for generating a plasma, the plasma density in the vicinity of the substrate can be made lower than in use of a conventional RF power.

(2) Optionally, by placing a magnetic field generator such as permanent magnets or the like so as to surround a target, most of a plasma can be kept in the discharge space surrounded by the target.

(3) Optionally, by further interposing a magnetic shield between a target and a substrate, a plasma of a high density is prevented from spreading near the substrate.

As more preferable deposition conditions, in order to make the desired plasma state for suppressing the damage due to positive ions and electrons, it is desirable to select such conditions that when the sputtering pressure is within the range of 0.3 to 3 Pa, the electron temperature Te of the plasma at the substrate position is not more than 3 eV, the electron density is not more than $2 \times 10^8$ electrons/cm$^3$, and the difference between the plasma potential and the floating potential of the substrate is not more than 2 V.

A film forming process using the above reactive sputtering apparatus will be described below in more detail.

First, because of the permanent magnet of the ring shape arranged at the back of the target so as to surround the target, a coaxial magnetron discharge condition in which the electric field perpendicular to the target surface intersects with the magnetic field approximately perpendicular to the radial direction is achieved on the sputtered surface of the substantially cylindrical internal wall part, thereby generating a magnetron discharge in which electrons fly in arcs perpendicular to the target surface (cycloid curves), collide with molecules of the sputtering gas to ionize them and move in the circumferential direction (closed loop). The ionized molecules of the sputtering gas are accelerated toward the target surface biased at the negative potential to collide with the surface, thus starting sputtering.

If at this time the ordinary reactive sputtering method is carried out using the target readily generating negative ions of Al, Mg, or the like, and a fluorine-containing gas in order to form a film of a fluoride such as aluminum fluoride, magnesium fluoride, or the like, a thin film of a compound containing fluorine, such as aluminum fluoride (e.g. $AlF_3$), magnesium fluoride (e.g. $MgF_2$), or the like, will be formed on the target surface because of influence of the reactive gas.

If the surface having such a fluoride formed thereon is sputtered, negative ions will be formed in part. The negative ions thus formed will be accelerated by the ion sheath voltage and come to have a large kinetic energy and a directivity.

In general, negative ions or compounds coupled with negative ions are very unstable and collide with gas particles during flight to be neutralized into neutral particles. For this reason, the neutral particles with the directivity and large kinetic energy will impinge upon the substrate extensively damaging the substrate or the film formed thereon. Further, depending upon the sputtering conditions, the etching rate of the negative ions (turning into neutral particles during flight) may be greater than the deposition rate, resulting in a lack of film formation.

In the sputtering apparatus used in the present embodiment, the gas supplied through the anode fills the interior of the substantially cylindrical shape with the anode as a bottom surface and the target as a side surface, suppresses the reactive gas containing fluorine, supplied into the vessel, from intruding into the cylinder, suppresses fluorination of the target and anode, and maintaining the surfaces of the target and anode in the metal state.

Particularly, the suppression of fluorination of the anode surface also has the effect on stabilization of discharge (prevention of an abnormal discharge due to charge-up), and the suppression of fluorination of the target surface has the great effect on suppression of formation of negative ions. It is, therefore, more preferable to make the anode in such a structure as to discharge the sputtering gas containing no fluorine.

In this manner, target atoms sputtered in the metal state are fluorinated by collision with the fluorine-based gas during the process of flight to the substrate, or even if they arrive in the metal state at the substrate surface, they will be fluorinated by colliding with the fluorine-based gas molecules entering the substrate surface, thereby forming the desired thin fluoride film on the surface of the substrate.

As described above, on the sputtered surface of the substantially cylindrical internal wall part, attained is the coaxial magnetron discharge condition in which the electric field perpendicular to the target surface intersects with the magnetic field substantially perpendicular to the radial direction. The magnetron discharge is generated in which electrons fly along arcs perpendicular to the target surface (cycloid curves) and move in the circumferential direction (closed loop) while colliding with the sputtering gas molecules to ionize them, so that the plasma of a high plasma density is confined inside the substantially cylindrical internal surface. Most of the electrons not confined by the magnetron magnetic field fly toward the anode. As described above, the cathode of the substantially cylindrical internal wall part is placed near the anode on the bottom surface of the substantially cylindrical shape to generate the strong electric field, so that most of the electrons are captured by the anode.

However, some electrons coil around the magnetic field 50 on the side of the opening of the target to spread into the space between the target and the substrate. The magnetic shield can effectively suppress this plasma existing near the substrate. The magnetic shield captures the electrons moving as coiling around the magnetic field on the opening side of the substantially cylindrical target and also prevents leakage of magnetic flux from the target, thereby enabling the magnetic flux density near the substrate to be lowered and thus enabling decrease of the electron temperature Te of the plasma near the substrate, the electron density Ne, and the plasma potential Vp.

There are no specific restrictions on the material of the magnetic shield as long as it is a magnetic material. Preferred materials are permalloys, soft iron, and so on. The magnetic shield is desirably one for preventing leakage of the plasma to the vicinity of the substrate without impeding passage of the sputtering particles emitted from the target as much as possible, and the diameter of the holes is desirably within the range of 5 to 10 mm. The aperture rate of the magnetic shield is desirably 50 to 80%. When the aperture rate is not more than the upper limit, it becomes feasible to confine the plasma in the substantially cylindrical shape in the practically acceptable range while still maintaining sufficient film forming rates. When the aperture rate is not less than the lower limit, it is feasible to confine the plasma while realizing practically acceptable film forming rates.

However, decreasing the plasma density in the vicinity of the substrate has a great effect on suppressing the plasma damage on the substrate. To the contrary, in the case of the reactive sputtering utilizing, for the surface reaction, the energy of ions entering from the plasma into the substrate surface, the reaction rate on the substrate surface might decrease. In that case, He gas is used as a kind of sputtering gas for promoting the reaction on the substrate surface to be introduced into the high density plasma, thereby efficiently making the metastable state of He gas (positive ions of He). Since He gas in the metastable state has a long life, the gas is transferred to the substrate to impinge on the substrate surface, thus giving its energy to the surface to promote the reaction.

During film formation, the temperature of the substrate increases mainly for two reasons. The first reason is a temperature rise due to electron impact and the other is radiation from the target. The temperature rise due to the electron impact from the plasma can be suppressed by lowering the electron temperature Te and the electron density Ne in the vicinity of the substrate as described above. Since normals to the sputtered surface of the target do not intersect with the film forming surface of the substrate on the substrate holder, the effective radiation amount from the sputtered surface is small, so that the rise of the substrate temperature can be suppressed.

As described above, it becomes feasible to implement sputtering to minimize the negative ion damage and the positive ion and electron damage as compared with the conventional methods, and thus obtain a high-quality fluorine-based thin film, which was difficult to obtain by the conventional sputtering methods.

The production process of a thin film according to each of the embodiments of the present invention described hereinafter is carried out using the sputtering apparatus of the same basic structure as in each of the embodiments described above. While monitoring the voltage applied to the target, the introducing rate of the reactive gas flowing between the substrate and the opening is controlled by a reactive gas introducing rate control means so that the voltage of the target becomes substantially constant.

In this manner, without varying the flow rate of the inert gas supplied into the hollow part and the voltage applied to the target, by controlling the introducing rate of the reactive gas such that the surface of the target can be readily maintained in the metal state and the target voltage is thus maintained constant, it is possible to stabilize the sputtering rate at a high level.

Embodiment 3

Figure 7:
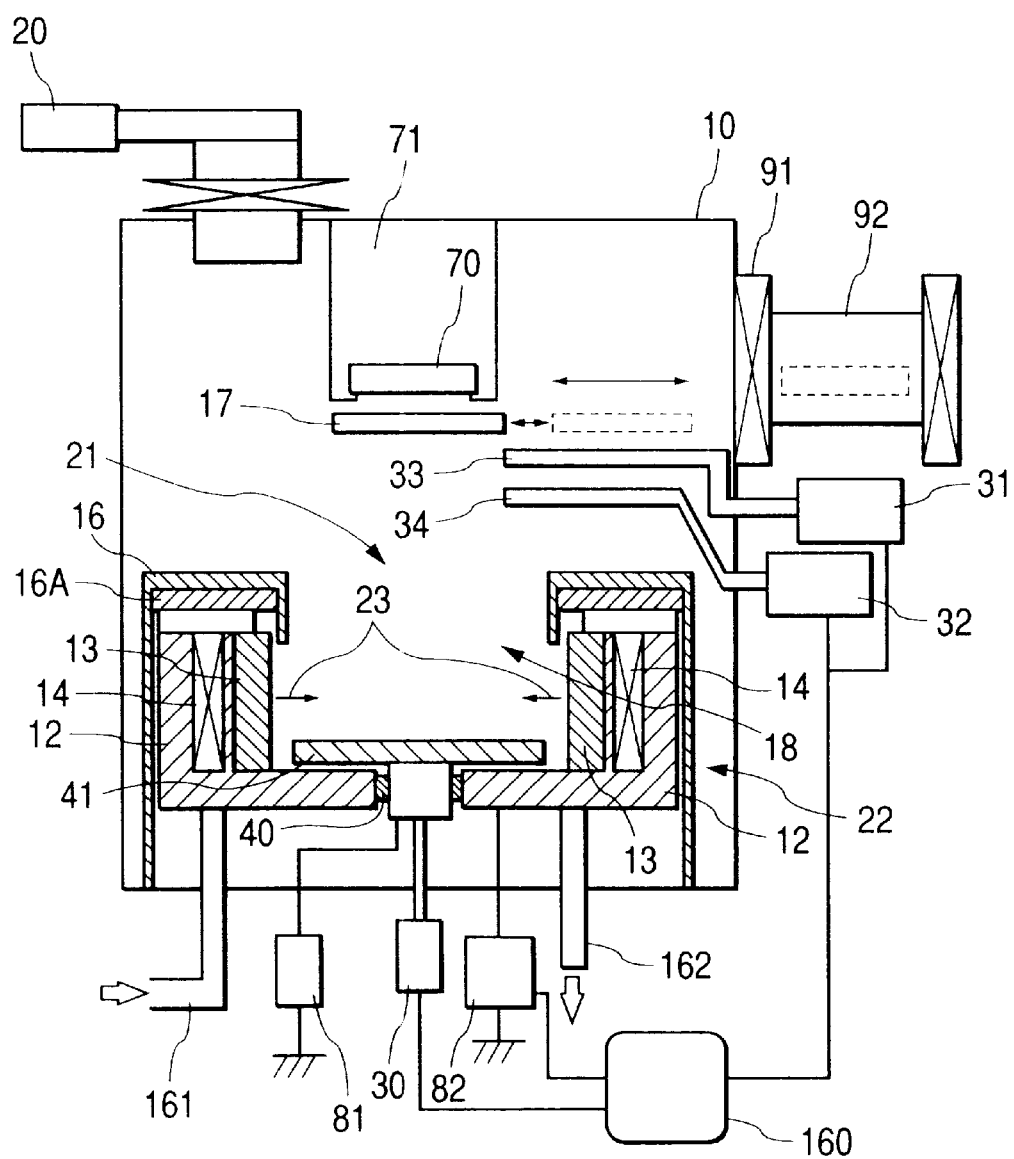
FIG. 7 is a schematic view showing a still another sputtering apparatus used in the present invention.

FIG. 7 is a schematic cross-sectional view of a DC magnetron sputtering apparatus used in the production process of a thin film according to Embodiment 3 of the present invention.

The sputtering apparatus is provided with a vessel 10 for maintaining the interior in a substantially vacuum state and an evacuation system 20 consisting of a vacuum pump or the like for evacuating the vessel 10.

Inside the vessel 10 there is provided a sputter electrode section 22 with an aperture 21, in which a metal target 13 of a hollow shape to be sputtered is mounted, and a substrate 70 to be processed to form a thin film thereon is held on a holder 71. Between the opening 21 and the substrate 70, there are supply ports 33, 34 of a first reactive gas supply system 31 for supplying a reactive gas such as a fluorine-containing gas, an oxygen-containing gas, or the like and a second reactive gas supply system 32 for supplying a reactive gas such as $H_2$, $H_2O$, or the like, and the reactive gas introducing systems and evacuation system are arranged to prevent the reactive gases from readily diffusing to the surface of the target 13.

The sputter electrode section 22 is provided with a cathode-target holder 12 equipped with cooling pipes 161, 162 as cooling means and being an electrode of a hollow shape with an opening at one end, an anode 41 placed at the other end of the cathode 12 with an insulator 40 therebetween, an earth electrode-shield plate 16 insulated from the cathode 12 by an insulator 16A, and a hollow magnetron sputter source consisting of a target 13 placed in contact with and electrically connected to the cathode 12, and a magnet 14 and a yoke for forming a magnetic circuit on the surface of the target 13.

To the hollow part forming the discharge space 18 is connected to a sputter gas supply system 30 for supplying a sputtering gas (and a reducing gas if necessary).

The potential of the anode 41 is controllable by a dc power supply 81 for the anode. A voltage resulting from superposition of a dc bias and high frequency or rectangular waves of 1 kHz to 500 kHz can be applied from a sputter power supply 82 to the cathode 12, so that the power induces a discharge in the discharge space 18 on the surface of the target 13, thus sputtering the target 13. Further, the construction is adopted in which the plasma is confined in the hollow part 18 and even if negative ions are made in part of the target surface, they can be prevented from directly entering the substrate 70.

A quickly openable/closable shutter 17 is disposed in front of the substrate 70 located so as to face the anode 41 with the target 13 therebetween. This substrate 70 is transferred through a gate valve 91 to or from a load lock chamber 92, so that the substrate 70 is carried into or out of the vessel 10 without exposing the interior of the vessel 10 to the atmosphere. When the substrate is set in the vessel 10, it is located at the position where it does not intersect with the normals 23 to the surface of the target 13.

A control unit 160 is provided to monitor and control the flow rates of the gases introduced from the first reactive gas supply system 31, the second reactive gas supply system 32, and the sputter gas supply system 30 and the voltage of the target 13.

A production process of a thin film using the apparatus illustrated in FIG. 7 will be described below.

The cylindrical target 13 of, for example, a high purity metal Mg (99.9%) is mounted on the cathode 12.

The substrate 70, like a synthetic quartz glass plate, is cleaned and placed in the load lock chamber 92 and the interior of the chamber is evacuated to below about $1 \times 10^{-4}$ Pa. At this time, the substrate is preferably cleaned for the purpose of removing organic matter by heating or ultraviolet irradiation or the like in order to remove contaminants on the surface of the substrate 70, which is very effective in stabilizing the quality of the film. After completion of the evacuation, the substrate 70 is transferred through the gate valve 91 onto the holder 71 to be held thereon.

The holder 71 is internally provided with a heater and thus a film can be formed while heating the substrate 70 to temperatures of up to 400 C. However, because film formation is carried out at room temperature in the present embodiment, the heater is kept off in this case.

Then, the shutter 17 is closed, and Ar and $H_2$ are introduced from the sputter gas supply system 30. Furthermore, the reactive gas supply systems 31, 32 supply a mixed gas of $F_2$ and Ar diluted in about 5 vol % and $H_2O$ so as to attain a total pressure of about 0.3 Pa to 3 Pa. A sputter power of about 300 W is applied to the cathode 12 to generate a magnetron plasma on the surface of the target 13. At the same time, a rectangular voltage of 1 kHz to invert the polarities of the target surface is superimposed to cancel the charge on the target surface and others, thereby maintaining the discharge stable. It is noted that the introducing rates of the respective gases, the pressure, the sputter power, and the rectangular voltage are not limited to the above specific values.

The gas introducing part of the anode 41 is as described above and is preferably a member having many holes for permitting the gas to be uniformly introduced onto the sputtered surface of the target 13 of the hollow shape, or a porous member made of the same material as the target 13. Here, the flow rate, purity, and pressure of the introduced gas are accurately controlled.

On the sputtered surface of the target 13, the electric field is formed perpendicularly to the magnetic field of the maximum flux density of $250 \times 10^{-4}$ T formed parallel to the sputtered surface by the aforementioned magnets 14. When the magnetic field and the electric field are formed perpendicularly to each other in this fashion, electrons moving by the electric field applied to the target 13 are turned by the magnetic field and move in cycloid motion to be trapped by the surface of the target 13 of the flat plate shape. The electrons in cycloid motion have long flight distances, so that their probability of collision with the gas molecules increases. The gas molecules colliding with the electrons are ionized to generate the magnetron discharge. Since the negative voltage is applied from the sputter power supply 82 to the target 13, the ionized gas molecules are accelerated toward the sputtered surface of the target 13 and then collide with the target 13 to sputter the target material. At this time, the color of discharge varies from pale blue green (discharge color of argon) to green (discharge color of Mg) depending on the applied power and the partial pressure of $F_2$ gas. For high-speed sputtering, it is preferable to implement the sputtering under the green discharge conditions in which the surface of the target 13 is kept in the metal state.

Although not illustrated in FIG. 7, by installing an emission spectrophotometer, spectroscopically measuring the emission from the surface of the target 13, and always controlling the partial pressures of the reactive gases so as to maintain the intensity and wavelength of the emission color of the target metal, it becomes feasible to implement stable film formation while maintaining the surface of the target 13 in the metal state.

It is also possible to maintain this state by use of a mass spectrometric analyzer or the like instead of the emission spectrophotometer.

Since the $F_2$ gas reacts with $H_2O$ to form HF, they are introduced from the separate introducing systems. The $H_2$ gas and Ar are introduced together and this is not only for the purpose of introducing them simply as sputtering gases, but also for the purpose of carrying out the reaction with $F_2$ in the deposition atmosphere as much as possible and for the purpose of introducing the $H_2$ gas into the plasma formed on the surface of the target 13 to generate active H atoms and $H_2$ molecules, thereby enhancing the reactivity.

The discharge is maintained for a while, and when the discharge has been stabilized, the shutter is opened to form a film of $MgF_2$ on the substrate 70.

When the target voltage during the film formation is monitored in situ (to effect in-situ monitor) by the control unit 160, a phenomenon in which the absolute value of the target bias voltage gradually decrease is observed. The inventors have found that this is caused by a change in the state of the surface of the target 13 because of a variation in the partial pressures of $F_2$ and $H_2O$ in the vacuum vessel or the like. An example of such variation in the target bias voltage is presented in FIG. 8A.

The film formation in this state will result in a heterogeneous film having its refractive index varied in the direction of the thickness. Further, the sputtering rate is unstable, so that the quality of the film is unstable.

Furthermore, in the case where the partial pressure of $F_2$ is high and the power applied to the target is low, the sputtering rate undergoes an extreme decrease. This is because a fluoride film, such as a $MgF_2$ film, is formed on the target surface.

Namely, in order to form a fluorine-containing film at a higher speed, with better homogeneity, and with good repeatability, the target surface needs to be always kept in the metal state. However, it is very difficult to always monitor the target surface and maintain it in a constant state.

Therefore, film formation is carried out while controlling the partial pressures of $H_2O$ and $F_2$ to suppress the variation with the lapse of time of the target bias voltage. Specifically, the control unit 160 monitors the target bias voltage and controls the gas introducing rates so as to keep the voltage value constant, thereby forming a fluorine-containing film such as an $MgF_2$ film. FIG. 8B shows the dependence of the target bias voltage (in the negative sign) on the supply rate of $H_2O$ gas. In such a case, the control can be done in a tendency to reduce the supply rate of $H_2O$ gas with the lapse of time.

Further, maintaining the target potential constant in this fashion makes the sputtering rate stable, so that the thickness of the film can be controlled with a very high accuracy by controlling the film forming time.

As described above, the present embodiment makes it possible to form a fluorine-containing film such as a $MgF_2$ film at room temperature. Accordingly, it is also possible to use a plastic material or the like as the substrate 70. Further, since the sputtering rate is stable, it is also feasible to control the film thickness with higher accuracy than by the conventional evaporation methods, thereby forming high-quality optical thin films and fabricating optical parts with asdesigned characteristics, including antireflection films and mirrors by stacking such optical thin films.

The present embodiment employed Mg as the target 13 and Ar, $H_2$, $F_2$, and $H_2O$ as the gases, but Ar as the sputtering gas may be replaced by a rare gas such as He, Ne, Kr, Xe, or the like.

The reducing gas may be any gas that can supply H by dissociation in the plasma, such as $CH_4$, $NH_3$, and so on, instead of $H_2$.

The fluorine-containing gas may be a gas such as $CF_4$, $NF_3$, $SF_6$, and so on, instead of $F_2$.

Furthermore, $H_2O$ gas may be replaced by $H_2O_2$ or the like.

When the rectangular voltage of not less than 50 kHz is superimposed for prevention of an abnormal discharge, there is a possibility that the discharge may spread and the absorption in the ultraviolet region may increase in the case of thin fluoride films susceptible to plasma damage. Thus, when a thin fluoride film with a low absorption in the ultraviolet region is necessary, it is preferable to use a frequency of not more than 50 kHz.

Using the apparatus, it is also feasible to form a thin oxide film of $Al_2O_3$ or the like that forms a multilayer film together with a fluorine-containing film. In this case, an optical thin film with a low absorption can also be obtained by superimposing high frequency or rectangular waves of 1 kHz to 500 kHz for prevention of an abnormal discharge. When such high frequency waves are not superimposed, many particles are incorporated in the film because of the abnormal discharge to provide a film with large scattering.

In the present embodiment, by forming the hollow section 18 as a substantially closed target space, and by adopting the constitution such that gases of Ar, $H_2$, etc. are flown into the hollow section 18 to reduce the partial pressures of the reactive gases of $F_2$, $H_2O$, etc. in the vicinity of the target 13, and further by keeping the target voltage constant, it is possible to form a high-quality thin film.

The target voltage is strongly dependent on the surface condition of the target 13. For realizing high-speed sputtering in the present embodiment, the surface condition of the target needs to be kept in the metal state. For this reason, it is necessary to make the partial pressures of the reactive gases near the surface of the target 13 as low as possible.

Therefore, in the present embodiment, the target bias voltage is regulated, particularly, by controlling with the control unit 160 the supply flow rates of $F_2$ or $H_2O$ supplied from the first reactive gas supply system 31 and from the second reactive gas supply system 32 between the substrate 70 and the target 13 such that their partial pressures decrease with the lapse of time.

By contrast, if the flow rate of the sputtering gas of Ar or the like introduced into the hollow section 18 or the power applied to the target 13 is varied, the partial pressure of the reactive gas in the vicinity of the surface of the target 13 becomes variable, which results in failing to stabilize the film quality and the sputtering rate.

As described above, according to the production process of a thin film of the present embodiment, by controlling with the control unit 160 the introducing rates of the reactive gases flowing between the substrate 70 and the target 13, i.e., to the exterior of the sputter electrode section 22 and between the substrate 70 and the opening 21, it is possible to reduce the partial pressures of the reactive gases in the vicinity of the target 13 disposed in the hollow section 18 of the sputter electrode section 22 and to maintain the target voltage constant. This makes it easier to keep the target 13 in the metal state and permits the sputtering rate to be kept high and stable by controlling the target voltage at a constant level, thereby forming a non-heterogeneous, high-quality optical thin film. Since the sputtering rate can be stabilized, the film thickness can be controlled with a high accuracy by controlling the film forming time.

Further, since the plasma is confined in the hollow section 18, and since negative ions formed in part of the target surface are also kept from directly entering the substrate 70, the substrate 70 is prevented from being damaged by charged particles.

By introducing the gas of $H_2$, $CH_4$, $NH_3$, or the like into the hollow section 18 to be dissociated in the plasma to supply H atoms and active $H_2$ molecules to the vicinity of the substrate 70, unnecessary oxygen in the film is reduced and removed and dangling bonds are terminated, thereby making it feasible to form an optical thin film with a low absorption in the ultraviolet region. Particularly, by reducing MgO taken into the film during formation of an $MgF_2$ film, it is feasible to obtain an optical thin film with a low absorption even in the vacuum ultraviolet region.

Further, the superposition of the high frequency waves of 1 kHz to 500 kHz can prevent the abnormal discharge due to the charge accumulation and also prevent contaminants from being incorporated into the film.

Then, by forming such a high-quality optical thin film at a high speed in a monolayered or multilayered structure on a substrate to form an antireflection film, a mirror, a beam splitter, or the like, it becomes feasible to provide high-quality optical members at a low cost.

Embodiment 4

Figure 9:
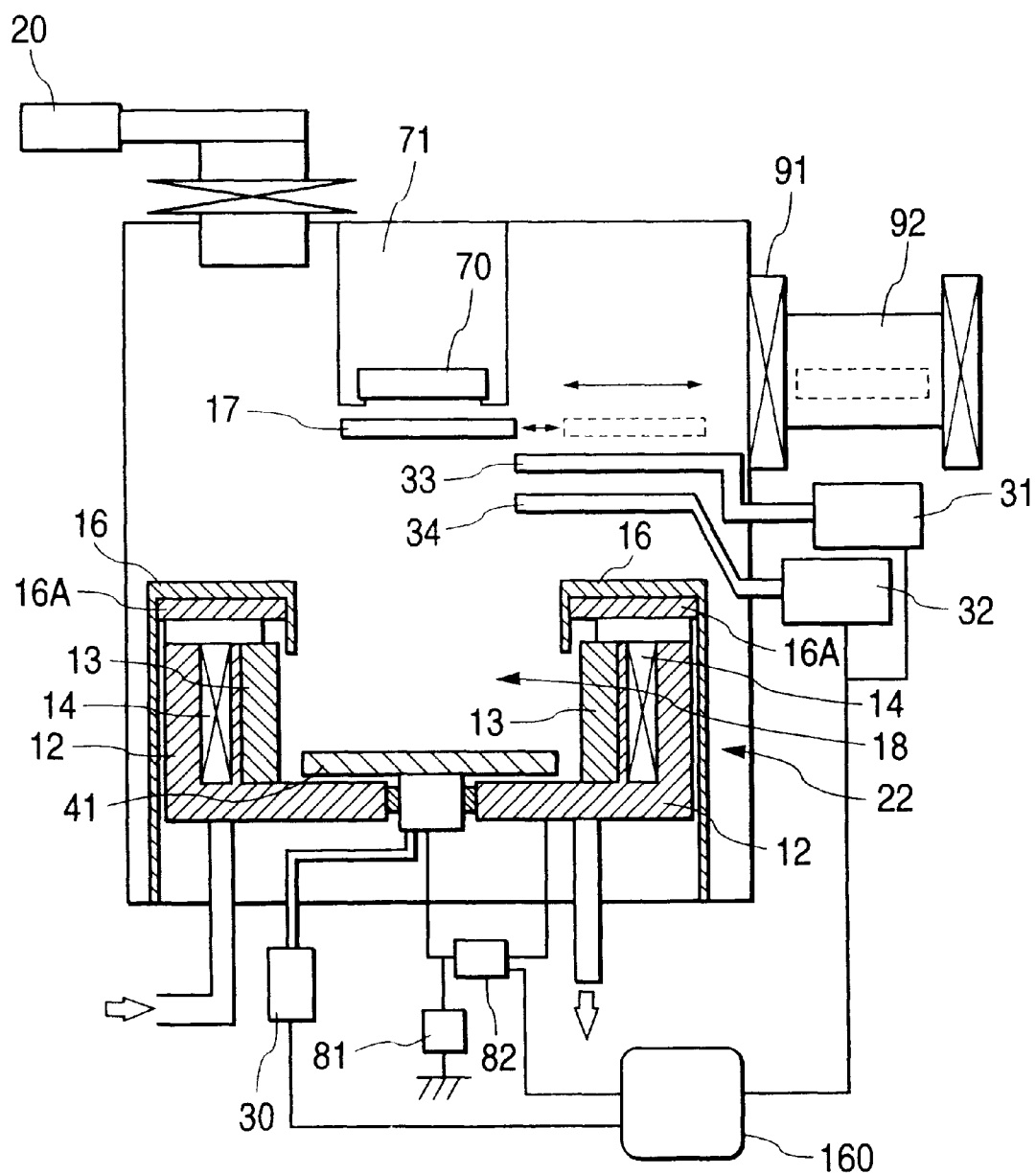
FIG. 9 is a schematic view showing yet another sputtering apparatus used in the present invention.

Next, FIG. 9 is a schematic cross-sectional view of a sputtering apparatus used in the production process of a thin film according to Embodiment 4 of the present invention.

The sputter power supply 82 for supplying a sputter power to the cathode 12 is perfectly floating from the earth potential and the sputter power supply 82 is configured to apply a voltage between the anode 41 and the cathode 12. Further, the anode potential can be set either positive or negative relative to the earth potential, by using an anode dc power supply 81.

When the anode potential is set positive relative to the earth, the plasma potential becomes higher than the earth potential, so that positive ions generated in the plasma are released to the substrate 70 side.

When, however, the anode potential is set to be negative relative to the earth, the plasma potential becomes lower than the earth potential, so that electrons in the plasma are released to the substrate 70 side.

In this fashion, controlling the anode potential makes it feasible to form a film while changing the plasma density in the vicinity of the substrate 70.

Since the structure except for the above is fundamentally similar to that of the thin film forming apparatus described in the third embodiment, the detailed description thereof is omitted from this embodiment.

As described previously, the film can be damaged when the plasma density is high and the electron temperature is also high in the vicinity of the substrate 70 during film formation. However, when this apparatus is applied to form a film of an oxide such as $Al_2O_3$ or the like, it is then necessary to positively utilize the assistance of plasma in order to increase the density and refractive index of the film.

In such cases, it is effective to control the anode potential to the positive or negative side relative to the earth, thus positively increasing the plasma density in the vicinity of the substrate 70.

The present embodiment can also improve the thin fluoride films in density, adhesion, and hardness of the film by increasing the plasma density to some extent.

As described above, the control of the voltage of the anode 41 by the control unit 160 can control the plasma density in the vicinity of the substrate 70 to increase the concentration of reactive, active species depending on the kind of the formed film, thereby enhancing the reactivity, or to increase the incident energy and density of Ar ions to the substrate 70 during film formation to improve the denseness and adhesion of the film. Furthermore, controlling the Ar ion energy can reduce the concentration of Ar taken into the film to provide a low-absorption optical thin film.

Further, in the present embodiment, similarly to Embodiment 3, by controlling the introducing rates of the reactive gases flowing between the substrate 70 and the target 13 with the control unit 160, it is also feasible to reduce the partial pressures of the reactive gases in the vicinity of the target 13 disposed in the hollow section 18 of the sputter electrode section 22 and to maintain the target voltage constant. This makes it easier to keep the target 13 in the metal state and maintaining the target voltage constant permits the sputtering rate to be increased and stabilized, whereby an optical thin film can be formed without heterogeneity and of a high quality. Since the sputtering rate can be stabilized, high-accuracy film thickness control can be implemented using the film forming time as a parameter.

By introducing the gas of $H_2$, $CH_4$, $NH_3$, or the like into the hollow section 18 to be dissociated in the plasma to supply H atoms and active $H_2$ molecules to the vicinity of the substrate 70, unnecessary oxygen in the film is reduced and removed to terminate the dangling bonds, thereby enabling formation of an optical thin film having a low absorption in the ultraviolet region. Particularly, during formation of an $MgF_2$ film, by reducing MgO taken into the film during the film formation to terminate dangling bonds of Mg and MgO to form MgH and MgOH, it is feasible to obtain an optical thin film having a low absorption even in the vacuum ultraviolet region.

Then, by thus forming a high-quality optical thin film at a high speed in a monolayered or multilayered structure on a substrate to form an antireflection film or a reflection enhancing film, it is feasible to provide such high-quality, inexpensive optical parts as lenses, mirrors, beam splitters, and the like.

EXAMPLES

Example 1

The present invention will be described hereinafter in further detail with reference to the drawings. The following will describe a process of forming an $MgF_2$ film adaptable for the range from the visible region to the vacuum ultraviolet region.

First, the reactive sputtering apparatus of the same structure as illustrated in FIG. 1A was prepared. The sputter gas introducing system 30 connected to the anode was arranged such that the bottom surface of the anode had a number of holes so as to be able to uniformly introduce the gas to the cylindrical target sputter surface. The ringlike permanent magnets 14 used was one capable of forming a magnetic field of a maximum magnetic flux density of 250 Gauss parallel to the sputter surface and the electric field perpendicular thereto, in the vicinity of the sputter surface of the target 13.

The target 13 used was a 99.99% purity metal Mg target having an opening of about 4 inches in diameter and 70 mm in depth, and the substrate 70 used was a substrate of quartz glass with a low absorption at the ArF laser wavelength of 193 nm (trade name EDH; available from Nihon Sekiei).

After the substrate was held on the substrate holder 71 and at a position distant by 80 mm from the opening of the target and the interior of the vessel 10 was evacuated to a high vacuum condition by the vacuum pump 20, the sputter gas introducing system 30 as connected to the bottom surface of the anode started introducing a mixed gas of helium (He) gas at 100 sccm for assisting the surface reaction, argon (Ar) gas at 100 sccm as a main component of the sputtering gas, and hydrogen gas at 100 sccm as a reducing gas for removing dangling bonds from the interior of the film on the substrate, through the anode 41 into the space surrounded by the cylindrical target and the anode. At the same time, the reactive gas introducing system 31 started introducing a mixture of fluorine ($F_2$) gas diluted in 5 vol % with argon (Ar) at 200 sccm and water ($H_2O$) as a reducing gas for removing dangling bonds from the interior of the film on the substrate, at 5 sccm whereby the sputtering pressure was controlled within the range of 0.3 Pa to 3 Pa.

Then, in the closed state of the shutter 17, the DC power supply 80 applied the power of 0.5 kW to the anode 41 as a positive electrode and to the cathode 12 as a negative electrode, thereby initiating a discharge.

In this state, pre-sputtering was continued for ten minutes to remove an oxide layer and a contaminant layer from the target surface. After the discharge color turned into pale green to indicate that the metal was exposed in the target surface, the shutter plate 17 was opened to implement film formation for thirty minutes. This process resulted in formation a film of $MgF_2$ in a thickness of 300 nm on the substrate.

After that, the quartz substrate was taken out of the vessel and subjected to a measurement with a spectroscope, and it was found from the measurement that an excellent film was formed having a refractive index of 1.44 at the wavelength of 193 nm and demonstrating a low light absorption down to near 180 nm.

For investigating the plasma state in the vicinity of the substrate, the Langmuir probe (available from ISA JOBIN YVON SOFIE) for plasma measurement was set at the substrate position instead of the substrate and the plasma was generated under the same conditions as above to measure the plasma state, and it was found from the measurement that the electron temperature Te=2 eV, the electron density Ne=$8\times10^7$ electrons/cm$^3$, and the plasma potential Vp=1 V.

Example 2

A polycarbonate substrate was held instead of the quartz substrate on the substrate holder 71 and film formation was carried out under the same conditions as in Example 1. As a result, a transparent thin film of $MgF_2$ having excellent adhesion was also obtained on the resin substrate.

Further, a thermolabel for indicating the temperature on the substrate was attached to the substrate and film formation was conducted under the same conditions as above. Then, the polycarbonate substrate was taken out of the vessel to check the temperature of the thermolabel, and it was verified that the temperature was low, not more than 40 C.

Example 3

Using the reactive sputtering apparatus illustrated in FIG. 4, an $MgF_2$ film was formed under the same conditions as in Example 1. As a result, the obtained film showed optical film characteristics on the same level as those of the film obtained in Example 1.

Comparative Example 1

As a comparative example, a film formation experiment similar to the above was conducted using a high frequency power supply of 13.56 MHz instead of the DC power supply in the apparatus configuration of FIG. 1A. The high frequency discharge failed to confine the plasma in the space surrounded by the cylindrical target and the anode as the bottom surface of the substantially cylindrical shape, so that the plasma spread throughout the vacuum chamber. As a result, the formed $MgF_2$ film was brown and had a strong absorption for a light of wavelengths of 180 to 400 nm. The Langmuir probe for plasma measurement was set at the substrate position to measure the plasma state in the same manner as above, and it was verified therefrom that the electron temperature Te=6 eV, the electron density Ne=5×$10^9$ electrons/$cm^3$, and the plasma potential Vp=20 V.

It is speculated from the result that in Comparative Example 1, the plasma spread throughout the entire vacuum chamber caused excess electrons and positive ions to enter the film during the film formation, thereby degrading the film quality.

Comparative Example 2

Figure 14:
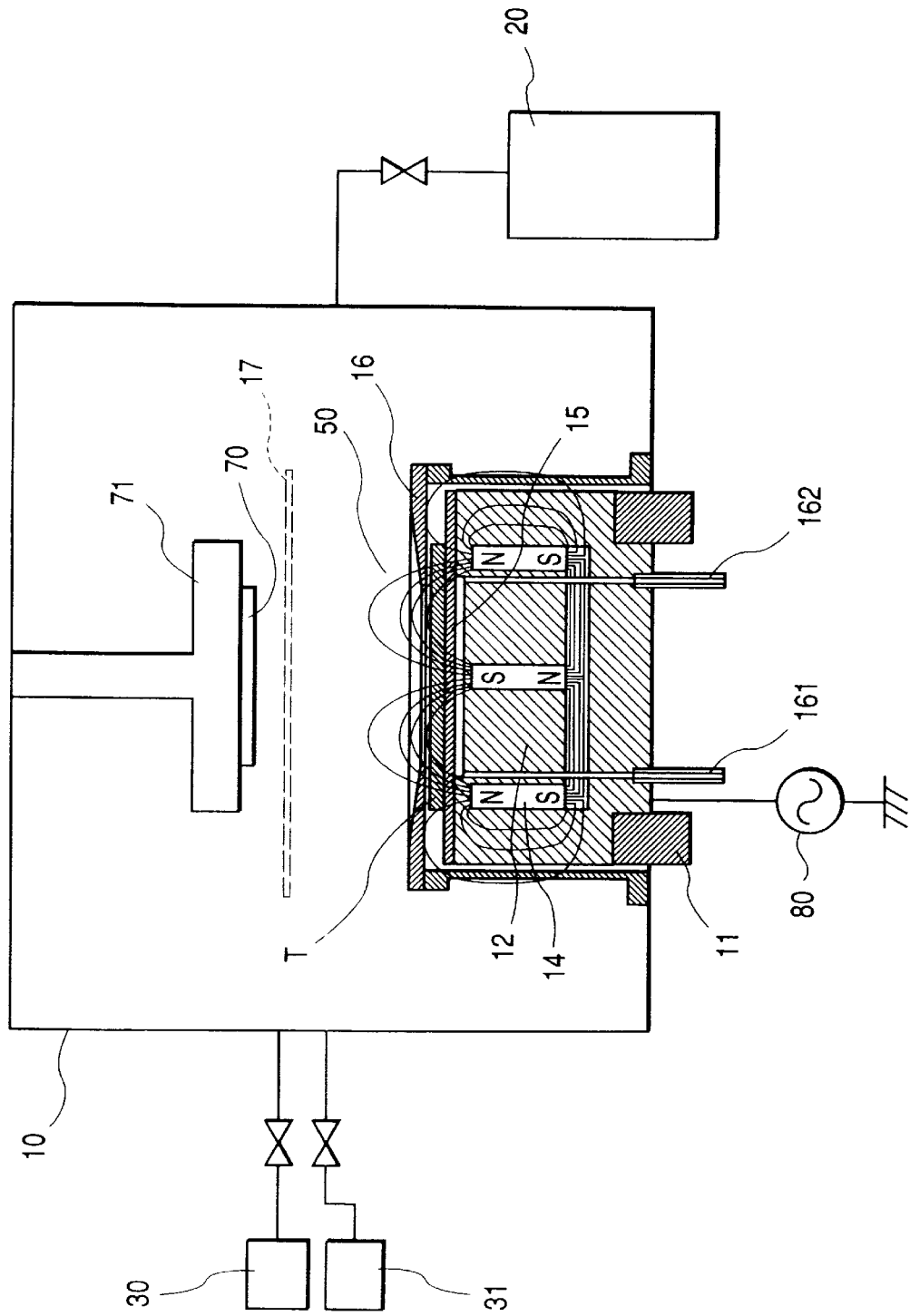
FIG. 14 is a schematic view showing a sputtering apparatus used for formation of thin films in comparative examples.

A parallel plate magnetron sputtering film forming apparatus illustrated in FIG. 14 was prepared.

In the structure of this apparatus, the portions denoted by the same reference symbols as in FIGS. 1A and 1B are of the same structure and the description thereof is omitted in this Comparative Example.

The sputtering gas for formation of plasma is introduced from the sputter gas introducing system 30 into the vessel. The fluorine-containing gas is introduced from the reactive gas introducing system 31 into the vessel 10.

The target holder 12 is fixed through the insulating member 11 to the vacuum chamber 10 and is mounted therein, and a flat plate type target T is set on the target holder 12 parallel to the substrate 70. A water cooling jacket is provided in contact with the back surface of this flat plate type target T and a cooling fluid is supplied through the cooling pipes 161, 162. The permanent magnets 14 are buried in the target holder 12 at locations corresponding to the central part and peripheral part of the flat plate type target, the permanent magnet in the central part being positioned with its pole S facing the substrate, and the permanent magnets in the peripheral part being positioned with their pole N facing the substrate, so as to make the magnetic field 50.

Numeral 16 designates the shield plate, which shields a discharge and also serves as an anode.

The RF power supply 80 applies a high frequency power to the target, whereby an RF plasma is generated in the vicinity of the flat plate type target.

A film formation experiment was conducted under the same film forming conditions as in Example 1, using a flat plate target of the shape having a diameter of 4 inches and a thickness of 6 mm.

As a consequence, no film formation was recognized in a region of the substrate that is in opposition to the sputter surface of the target. This is because the high-energy neutral particles originating in negative ions enter the substrate, as described previously.

Furthermore, a brown film was formed in a region of the substrate that is not in opposition to the sputter surface of the target. This is, conceivably, because the formed film was damaged by electrons and positive ions in the plasma in the vicinity of the substrate. The Langmuir probe was set on the substrate holder 71 to check the plasma state in the vicinity of the substrate, and it was found that at a location opposite the target the electron temperature Te was 8 eV and the electron density Ne was 2×$10^9$ electrons/$cm^3$ and that in a region not opposite to the target the electron temperature Te was 6 eV and the electron density Ne 8×$10^8$ electrons/$cm^3$.

Comparative Example 3

Furthermore, film formation was carried out under the above film forming conditions on the polycarbonate substrate using the conventional parallel plate magnetron system, and it seemed that there was a difference in thermal expansion in the substrate because of the locations of the substrate and the target, and the $MgF_2$ film appeared to peel off, which is considered due to the thermal expansion difference.

A thermolabel was attached to the polycarbonate substrate in the same manner as above to measure the temperature during the film formation, and the temperature was 100 C.

Example 4

Next, a process of forming a thin film using the apparatus illustrated in FIG. 7 will be described below.

The target material used was a high-purity Mg metal (99.9%) and it was mounted on the cathode.

The substrate to be processed like a synthetic quartz glass plate was cleaned and set in the load lock chamber, and the interior thereof was evacuated to below 1×$10^{-4}$ Pa. After completion of the evacuation, the substrate was transported through the gate valve onto the holder to be held thereon.

Then, the shutter was closed, Ar and $H_2$ were introduced each at 150 ml/min, a mixed gas of $F_2$ (5 vol %) and Ar was introduced at 100 ml/min, and $H_2O$ at 5 ml/min was introduced to set the total pressure to 0.3 Pa to 3 Pa. A sputter power of 300 W was then applied to the cathode to generate a magnetron plasma in the vicinity of the surface of the target. At the same time, a rectangular voltage of 1 kHz to invert the polarities of the target surface was superimposed on the sputter power.

The discharge was continued for a while, and the shutter was opened after the discharge has become stable.

Figure 8A:
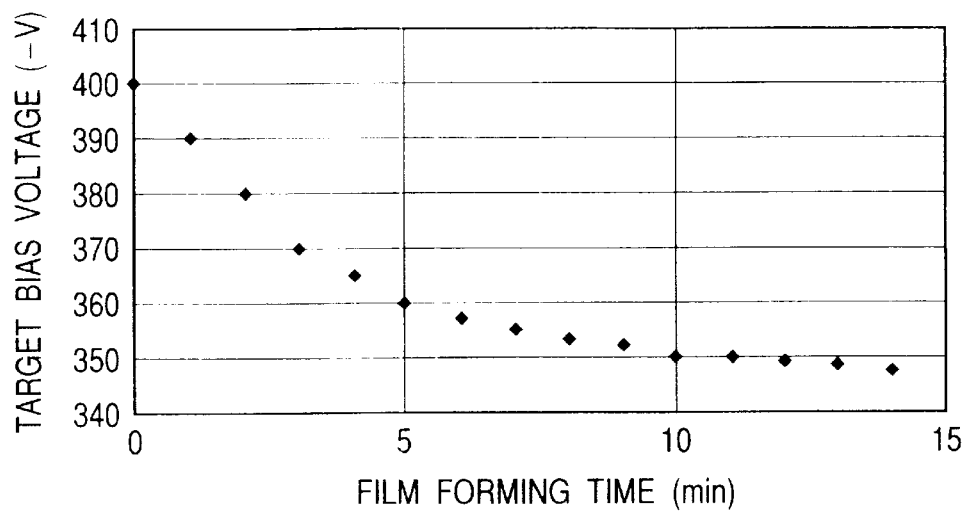
FIG. 8A is a graphical representation showing a relationship between film forming time and target bias voltage.
Figure 8B:
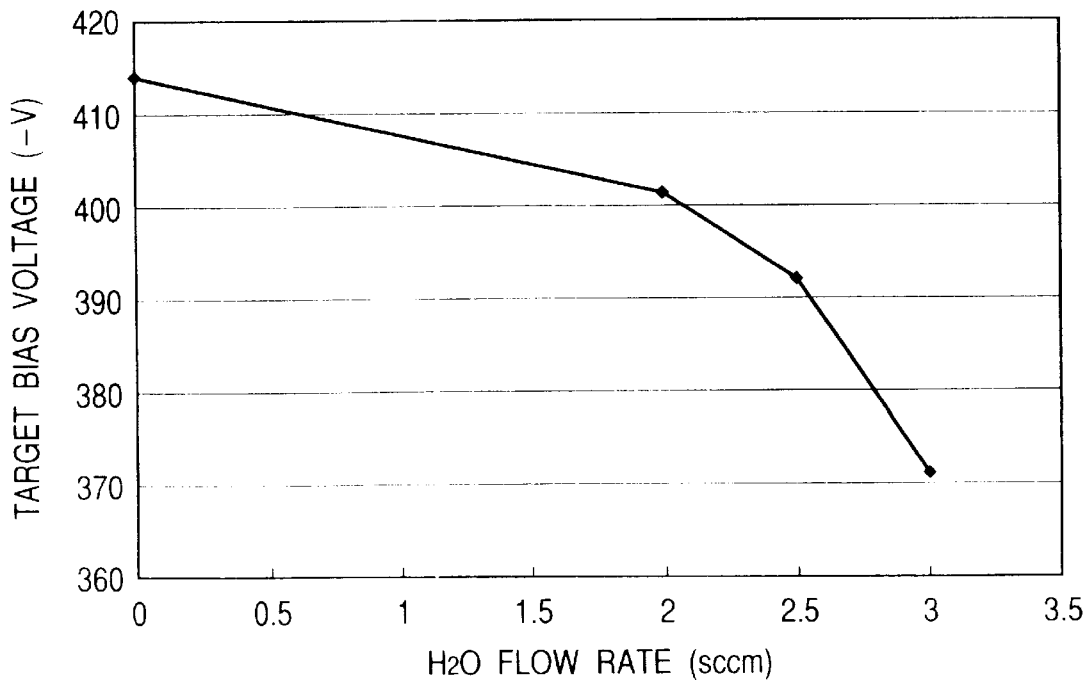
FIG. 8B is a graphical representation showing a relationship between flow rate of H$_2$O gas and target bias voltage.

Since such a variation with the lapse of time of the target bias voltage as illustrated in FIG. 8A would occur with the continuation of the film formation at the constant supply rate of $H_2O$ gas, the data in FIG. 8B was preliminarily inputted in the control unit and the flow rate of the gas in the present example was controlled based on this data.

Specifically, in order to avoid the decrease of the target voltage with the lapse of time during the film formation, the film formation was carried out to maintain the target voltage approximately constant by monitoring the target voltage and performing such control, so as to decrease the supply rate of $H_2O$ gas to adjust the partial pressures of the respective gases by the control unit 160.

Figures 10, 11:
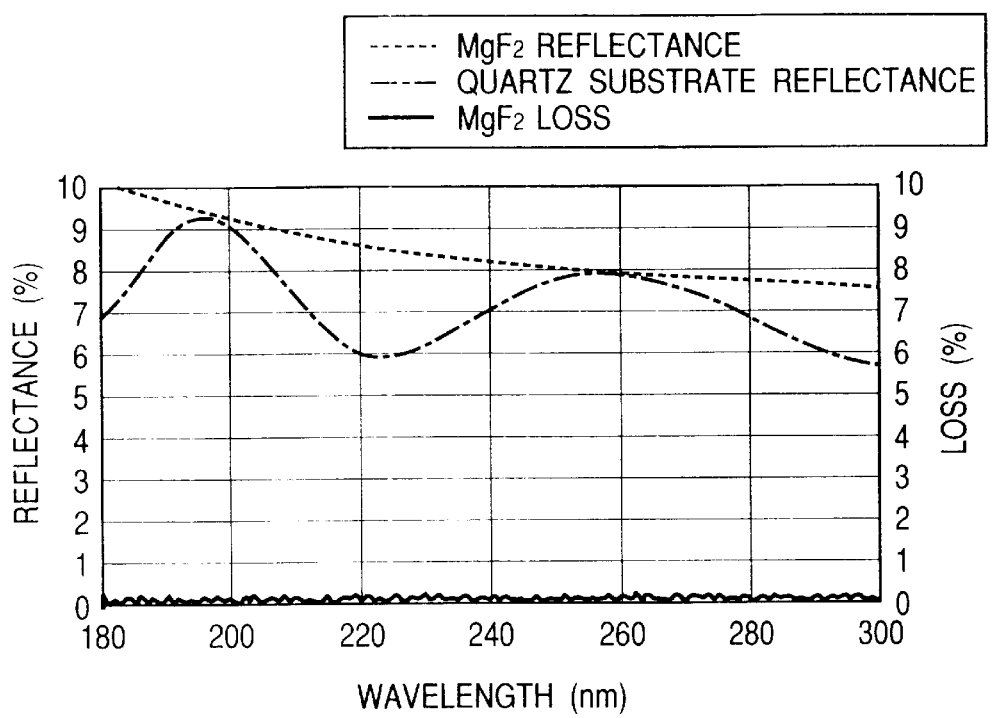
FIG. 10 is a graphical representation showing optical characteristics of an optical part.
FIG. 11 is a diagram showing a relationship between film forming parameters and characteristics of thin films.

The spectral characteristics of the $MgF_2$ film formed in this fashion are presented in FIG. 10. As is seen from FIG. 10, an $MgF_2$ film was formed without heterogeneity and having a low absorption in the range from the visible region to the ultraviolet region.

Although this was an $MgF_2$ film formed on the substrate 70 approximately at room temperature (not more than 40 C), the film had good adhesion and a hardness equivalent to that of an evaporated hardcoat (heating at 300 C). Further, the film had a packing density close to 100% and showed little variation in the spectral characteristics with the lapse of time.

Example 5

In the present example, film formation was carried following the same procedures as in the above example, using the apparatus illustrated in FIG. 7. Furthermore, in order to reduce absorption in the ultraviolet region, evaluation was conducted by carrying out various analyses of a relationship among the partial pressures of Ar, $F_2$, $H_2$, $H_2O$, etc. during the film formation, film composition, and absorption.

FIG. 11 presents analysis results of absorption at the wavelength of 193 nm and XPS (X-ray photoelectron spectroscopy) of $MgF_2$ films formed with the adjustment of the partial pressures. The films of $MgF_2$ contained several % of oxygen and binding states of this oxygen in the $MgF_2$ films were evaluated based on the relationship between film absorption and the ratio of MgOH linkage and MgO linkage by waveform separation of the binding energy of the 1 s orbit of oxygen. In Table 1, Loss (193 nm) film thickness of 100 nm means a loss including absorption and scattering at the wavelength of 193 nm, per thickness of 100 nm. The same interpretation also applies to Loss (248 nm) film thickness of 100 nm.

The oxygen incorporated into the $MgF_2$ films is considered to result from oxygen and $H_2O$ existing as residual gases after film formation or to be introduced at the time of communicating with the atmosphere after film formation, and it is impossible to completely eliminate the oxygen. Therefore, the inventors have investigated a way of reducing it by $H_2$ or a way of changing it into a state posing no problem in absorption even if it is incorporated into the film.

In Table 1, among samples No. 1 to No. 6, films demonstrating low Loss of 0.1% at 193 nm, i.e., low-absorption films, are No. 1 and No. 2. Films with low Loss of 0.1% at 248 nm are No. 1, No. 2, and No. 5. Namely, samples No. 1 and No. 2 are the films with the lowest absorption in both wavelength regions of 193 nm and 248 nm, and sample No. 5 is the film with low absorption equivalent to No. 1 and No. 2 in the wavelength region of 248 nm.

Now, let us discuss factors contributing to the low-absorption films.

In No. 1, a quarter of the oxygen content of 4.0 wt % of the film is oxygen participating with MgO. Namely, in No. 1, the oxygen concentration in the binding state of MgO is calculated as follows: 4.0 wt %×0.25=1.0 wt %.

In No. 2, 30% of the in-film oxygen content of 4.5 wt % is oxygen participating with MgO. Namely, in No. 2, the oxygen concentration in the binding state of MgO is calculated as follows: 4.5 wt %×0.3=1.35 wt %.

In No. 5, 35% of the in-film oxygen content of 6.5 wt % is oxygen participating with MgO. Namely, in No. 5, the oxygen concentration in the binding state of MgO is calculated as follows: 6.5 wt %×0.35=2.28 wt %.

In No. 1 and No. 2, the in-film oxygen content thereof is low, 4.0 wt % and 4.5 wt % respectively, and the ratios of MgO are also low. On the other hand, in No. 5, the in-film oxygen content is high, 6.5 wt %, but the ratio of MgO is low.

It became apparent from the above that the absorption of the film can be decreased when the oxygen content of $MgF_2$ is small and when the oxygen incorporated into the film exists not in the state of MgO, but in the state of MgOH (i.e., when the ratio of MgO is low). The oxygen content of the film could be reduced depending upon the partial pressure of $H_2$, but could not made perfectly null.

It was therefore clarified that an $MgF_2$ film with a particularly low absorption was obtained when the in-film oxygen content was not more than 5 wt % and when the concentration of oxygen in the binding state of MgO was not more than 1.5 wt %.

It was also clarified that when the partial pressure of $H_2O$ was not less than $1 \times 10^{-1}$ Pa, oxidation of $MgF_2$ proceeded to increase absorption in the short wavelength region and to make the stabilization of the target voltage difficult, and, as a result, it became difficult to stabilize the film quality and sputtering rate. It was also found, however, that when the partial pressure of $H_2O$ was not more than $1 \times 10^{-3}$ Pa, the in-film oxygen content and the MgO/MgOH ratio increased to provide a film having a large absorption.

Furthermore, it was also found that when the partial pressure of $H_2$ was not more than $5 \times 10^{-2}$ Pa, because the oxygen in the film was not reduced sufficiently and a part of $H_2$ contributed to the termination of dangling bonds of MgO and the like, the resultant film demonstrated a large absorption, particularly on the short wavelength side.

Namely, it was clarified that, in order to form an $MgF_2$ film having a low absorption in which the in-film oxygen content is not more than 5 wt % and in which the concentration of oxygen in the binding state of MgO is not more than 1.5 wt %, it is necessary for the partial pressure of $H_2O$ to be not less than $1 \times 10^{-3}$, but not more than $1 \times 10^{-1}$ Pa, and for the partial pressure of $H_2$ to be not less than $5 \times 10^{-2}$ Pa during film formation.

Example 6

Next, an $Al_2O_3/MgF_2$ multilayer antireflection film was formed on a quartz substrate, using the apparatus illustrated in FIG. 7, and the characteristics thereof were evaluated.

As in Example 4, an $MgF_2$ film was formed by using a high-purity Mg metal (99.9%) as the first target and introducing Ar, $F_2$, $H_2$, and $H_2O$ as gases.

An $Al_2O_3$ film was formed by using a high-purity Al metal (99.99%) as the second target and introducing Ar, He, $O_2$, $F_2$, $H_2$, and $H_2O$ as gases.

The operations of alternately forming the $MgF_2$ film and the $Al_2O_3$ film were carried out repeatedly, thereby obtaining the antireflection film.

Figure 12:
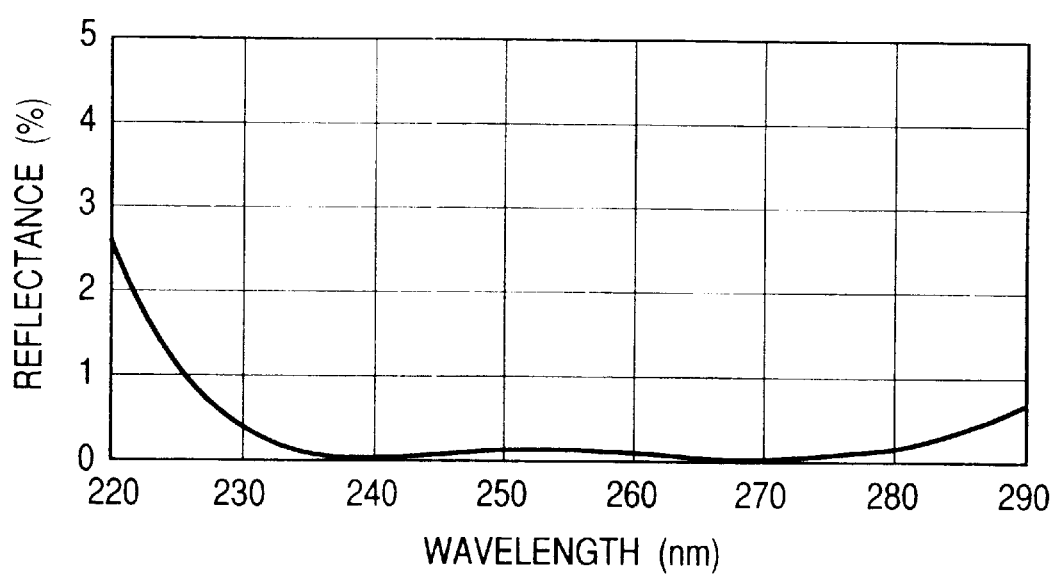
FIG. 12 is a graphical representation showing optical characteristics of an antireflection film.

The characteristics of the antireflection film thus obtained are presented in FIG. 12. Thus, an optical element can be fabricated that has a wide wavelength region of low reflectance and good reflection characteristics.

The transmittance of this element was high, not less than 99.8%, and the absorption was also very small. Furthermore, in the present example, since both $Al_2O_3$ and $MgF_2$ could be sputtered at a high speed and their sputtering rates were also stable, the antireflection characteristics as designed could be achieved at a high speed.

Example 7

In the present example, a low-absorption $MgF_2$ film was formed on a surface of a PC (polycarbonate) substrate, using the apparatus illustrated in FIG. 9, while setting the anode potential to +50 V to −50 V relative to the earth.

This $MgF_2$ film was analyzed by RBS (Rutherford backscattering), with the result that the film contained several % of Ar. Furthermore, the film was analyzed by XRD (X-ray diffraction) and it was verified therefrom that the thin film obtained was crystallized, the lattice spacing was 1 to 2% wider than that of the single crystal of $MgF_2$, and thus the $MgF_2$ crystal was distorted because of intrusion of Ar in the lattice. This Ar correlated with Ar ions entering the substrate, which resulted in a film containing a large amount of Ar, because of a large ion incidence that was superior in adhesion, denseness, and hardness. It was clarified that the $MgF_2$ film was particularly superior when the Ar content of the thin film of $MgF_2$ was about 1 to 10 wt %.

The amount of Ar introduced into the film varied depending upon various parameters including the Ar partial pressure of the film formation atmosphere, the film forming pressure, the sputtering rate, and so on, but it was verified that the plasma assist effect could be readily controlled by controlling the anode potential as in the apparatus illustrated in FIG. 9 and used in the present example and that high-quality $MgF_2$ thin films could be readily obtained.

When the assist effect of Ar ions was further enhanced, while the denseness and hardness of film increased, the absorption also increased. Further, distortion of the film became too large and peeling off of film also occurred. At this time, Ar in film was over 15%.

From the above results, by controlling Ar in the $MgF_2$ film within the range of 1 to 10 wt %, a dense, hard $MgF_2$ film is obtained that has a low absorption within the range from the visible region to the ultraviolet region and also has excellent adhesion to the substrate even at a low substrate temperature. Although the present example was described using Ar, similar effect can also be attained with other inert gases (He, Ne, Xe, Kr) that do not react with Mg or oxygen normally used in sputtering to eliminate absorption.

In the present example, an antireflection film was obtained with very good characteristics. In conventional sputtering, the substrate surface was damaged because of the effect of γ-electrons from the target and the obtained films had inferior adhesion. By contrast, the process of the present example allows to control the damage and enables to produce optical high-quality thin films that can be formed at a low substrate temperature.

Example 8

Next, an antireflection film for the $F_2$ excimer laser (wavelength 157 nm) consisting of $LaF_3$/$MgF_2$ multiple layers was formed on a fluorite substrate, using the apparatus illustrated in FIG. 7. $LaF_3$ can be replaced by $SiO_2$, $GdF_3$, or $NdF_3$ having a similar function.

An optical device of the present invention will be described below.

Thin films formed by the production process according to the present invention, as described above, can be suitably utilized as antireflection films or reflection-enhancing films of optical parts.

Optical devices such as laser oscillators, aligners, and so on can be fabricated by properly combining the optical members having these thin films.

Figure 13:
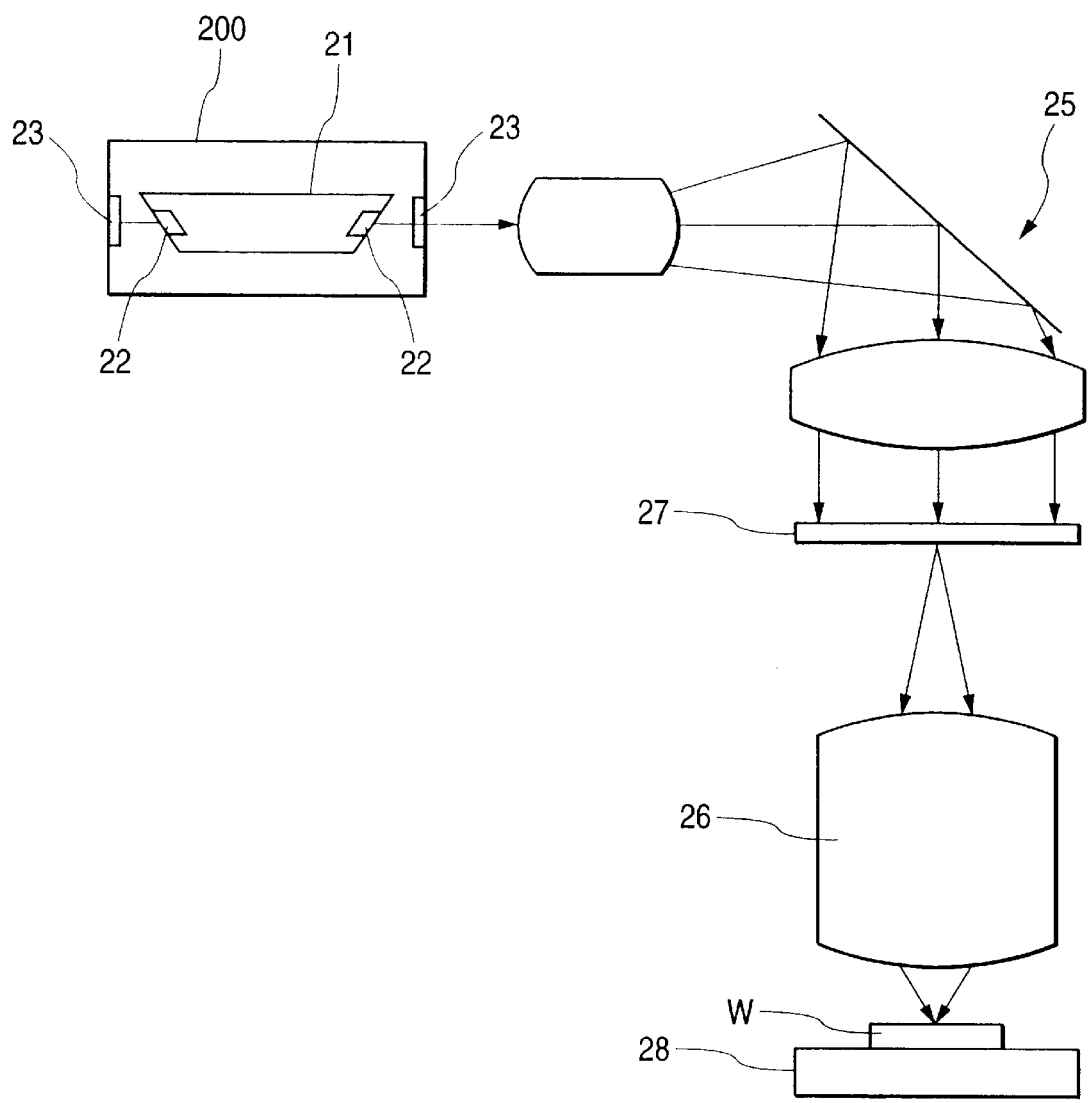
FIG. 13 is a schematic view showing an example of the optical device of the present invention.

FIG. 13 shows an aligner for photolithography having a laser oscillator, as an example of the optical device.

The laser oscillator 200 emits vacuum ultraviolet light such as an ArF excimer laser, $F_2$ excimer laser, or the like and has a laser gas chamber 21, and a pair of windows 22 and resonators 23 made of calcium fluoride. The aligner is constructed by assembling an illumination optical system 25, an imaging optical system 26, a stage 28, and so on, and each of the optical systems 25, 26 is composed of a plurality of lens units.

The optical parts with the thin films according to the present invention are used to make the windows 22, resonators 23, illumination optical system 25, imaging optical system 26, and so on.

The light having passed through an optical mask (reticle) 27 travels through the imaging optical system 26 to form a light image of the reticle 27 on a body to be exposed (work) W, which is mounted on a stage 28 as a holding means. Typical examples of the work W are substrates of Si wafers and glass plates or the like having a photoresist thereon.

In the case of the step-and-repeat system, the apparatus repeatedly carries out such an operation, that after exposure of an area of a first section, the stage is stepped and an area of a next section is exposed by a single-shot exposure or a scanning exposure. In the case of the scanning exposure, the exposure is carried out while moving the reticle relative to the stage.

This exposure makes a latent image in the photoresist and then the photoresist is developed to become a mask pattern for etching or ion implantation.

After that, using the mask pattern, ions are implanted in the substrate, or the substrate surface is etched.

In this fashion, devices can be fabricated in high integration density, using the optical device of the present invention.

According to the present invention, it is feasible to implement the film formation using target materials readily generating negative ions or the film formation of fluoride films susceptible to damage, which were impossible by the conventional parallel plate type magnetron sputtering, and also to form thin films with little plasma damage at a low temperature and at a high speed on plastic substrates and others vulnerable to heat.

Furthermore, when the target voltage is controlled to be at a substantially constant level by controlling the introducing rate of the reactive gas flowing between the substrate and the aperture while monitoring the voltage applied to the target, it is easy to keep the surface of the target in the metal state, the sputtering rate can be kept steadily high, and thin films having improved film characteristics and being transparent without absorption within the range from the visible region to the ultraviolet region can be formed at a low cost and at a high speed.

What is claimed is:

1. A process of producing a thin film, which comprises the steps of:
   providing a vessel;
   placing a target such that a surface to be sputtered of the target surrounds a discharge space;
   placing a substrate on a side of an opening of the space such that the substrate faces an anode disposed so as to close another opening of the space surrounded by the target;

supplying a sputtering gas and a fluorine-containing gas into the vessel; and supplying a dc power or a power obtained by superimposing pulses with reversing polarities on the dc power, between the target and the anode, wherein a discharge is induced in the discharge space to sputter the target, thereby forming a fluorine-containing thin film on the substrate.

2. The process according to claim 1, wherein the sputtering gas is supplied from the anode side into the discharge space and the fluorine-containing gas is supplied from the exterior of the discharge space into the vessel.

3. The process according to claim 1, further comprising the step of supplying a reducing gas from the anode side into the discharge space.

4. The process according to claim 1, wherein water is supplied from the exterior of the discharge space into the vessel.

5. The process according to claim 1, wherein the sputtering gas is a rare gas.

6. The process according to claim 1, wherein the fluorine-containing gas is at least one selected from fluorine gas, nitrogen fluoride gas, carbon fluoride gas, sulfur fluoride gas, of hydrofluorocarbon gas.

7. The process according to claim 1, further comprising the step of supplying a gas selected from hydrogen gas, deuterium gas, hydrocarbon gas, of ammonia gas, from the anode side to the discharge space.

8. The process according to claim 1, wherein the anode has a surface of the same material as the target, and a number of gas discharge holes.

9. The process according to claim 1, wherein a magnetic shield of a magnetic material having a number of holes is placed between the substrate and the target.

10. The process according to claim 1, wherein the target is comprised of a metal comprising at least one selected from Mg, Al, La, Nd, Th, Li, Y, Ca, and Gd.

11. The process according to claim 1, wherein the fluorine-containing thin film is magnesium fluoride, aluminum fluoride, lanthanum fluoride, neodymium fluoride, thorium fluoride, lithium fluoride, yttrium fluoride, calcium fluoride, or gadolinium fluoride.

12. The process according to claim 1, wherein on a surface of the substrate, an electron temperature Te of a plasma is not more than 3 eV, an electron density is not more than $2\times10^8$ electrons/cm$^3$, and the difference between the potential of the plasma and a floating potential of the substrate is not more than 2 V.

13. The process according to claim 1, wherein the substrate is comprised of calcium fluoride.

14. The process according to claim 1, wherein a voltage applied to the target is monitored and the supply rates of the gases are controlled such that the voltage applied to the target is kept substantially constant.

15. The process according to claim 1, wherein the frequency of the pulses is 1 kHz to 500 kHz.

16. The process according to claim 1, wherein during the film formation, the partial pressure of water is maintained not less than $1\times10^{-3}$ Pa nor more than $1\times10^{-1}$ Pa and the partial pressure of hydrogen gas is maintained not less than $5\times10^{-2}$ Pa.

17. The process according to claim 1, wherein the thin film is a film comprising magnesium fluoride as a main component and containing oxygen in a content of not more than 5 wt % and MgO in a content of not more than 1.5 wt %.

18. The process according to claim 1, wherein the thin film is a film comprising magnesium fluoride as a main component and containing a rare gas in a content of 1 wt % to 10 wt %.

* * * * *

UNITED STATES PATENT AND TRADEMARK OFFICE
CERTIFICATE OF CORRECTION

PATENT NO. : 6,458,253 B2
DATED : October 1, 2002
INVENTOR(S) : Kenji Ando et al.

It is certified that error appears in the above-identified patent and that said Letters Patent is hereby corrected as shown below:

Title page,
Item [56], OTHER PUBLICATIONS,
"Coaterspp." should read -- Coaters, pp. --.

Column 1,
Line 56, "highspeed" should read -- high-speed --; and
Line 62, "90" should read -- 90° --.

Column 4,
Line 37, "a still" should read -- still --.

Column 14,
Line 40, "decrease" should read -- decreases --.

Column 15,
Line 16, "asde-" should read -- as- --; and
Line 17, "signed" should read -- designed --.

Column 16,
Line 24, "in" should read -- in a --.

Column 19,
Line 9, "40" should read -- 40° --.

Column 20,
Line 36, "100" should read -- 100° --.

Column 21,
Line 12, "40 C)," should read -- 40°C), --; and
Line 14, "300 C)." should read -- 300°C). --.

Column 22,
Line 16, "not" should read -- not be --.

UNITED STATES PATENT AND TRADEMARK OFFICE
CERTIFICATE OF CORRECTION

PATENT NO. : 6,458,253 B2
DATED : October 1, 2002
INVENTOR(S) : Kenji Ando et al.

It is certified that error appears in the above-identified patent and that said Letters Patent is hereby corrected as shown below:

Column 25,
Line 24, "of" should read -- and --; and
Line 27, "of" should read -- and --.

Signed and Sealed this

Eleventh Day of March, 2003

JAMES E. ROGAN
*Director of the United States Patent and Trademark Office*